United States Patent
Toyohara et al.

(10) Patent No.: US 8,553,736 B2
(45) Date of Patent: Oct. 8, 2013

(54) LASER DEVICE AND METHOD FOR MANUFACTURING SAME

(71) Applicant: Fujikura Ltd., Tokyo (JP)

(72) Inventors: Nozomu Toyohara, Sakura (JP); Akira Sakamoto, Sakura (JP); Yohei Kasai, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 13/627,668

(22) Filed: Sep. 26, 2012

(65) Prior Publication Data

US 2013/0022066 A1 Jan. 24, 2013

Related U.S. Application Data

(63) Continuation of application No. PCT/JP2011/057181, filed on Mar. 24, 2011.

(30) Foreign Application Priority Data

Mar. 30, 2010 (JP) ................................. 2010-078967

(51) Int. Cl.
*H01S 3/04* (2006.01)
*G02B 6/36* (2006.01)

(52) U.S. Cl.
USPC ................................. 372/34; 385/88; 385/92

(58) Field of Classification Search
USPC ................................. 372/34; 385/88, 91, 92
See application file for complete search history.

(56) References Cited

U.S. PATENT DOCUMENTS

| 4,523,802 A | 6/1985 | Sakaguchi et al. |
| 4,955,683 A | 9/1990 | Shiga et al. |
| 6,758,610 B2 * | 7/2004 | Ziari et al. ...................... 385/92 |

FOREIGN PATENT DOCUMENTS

| JP | 57-138191 A | 8/1982 |
| JP | 61-224471 A | 10/1986 |
| JP | 01-225909 A | 9/1989 |
| JP | 01-225910 A | 9/1989 |
| JP | 01-229208 A | 9/1989 |
| JP | 1-270012 A | 10/1989 |
| JP | 1-177713 U | 12/1989 |
| JP | 01-306804 | * 12/1989 |

(Continued)

OTHER PUBLICATIONS

Xiaodong Zeng et al., "Coupling light from a laser diode into a multimode fiber", Applied Optics, Optical Society of America, Aug. 2003, Volk. 42, No. 22, pp. 4427-4430.

(Continued)

*Primary Examiner* — Armando Rodriguez
(74) *Attorney, Agent, or Firm* — Sughrue Mion, PLLC

(57) ABSTRACT

A laser device includes: a semiconductor laser element having an output surface; an optical fiber having a leading end portion facing the output surface of the semiconductor laser element; and an optical fiber supporting member for supporting the optical fiber, the optical fiber supporting member being made from a non heat insulating material and having a bonding pad to which the optical fiber is fixed by use of solder. The optical fiber supporting member includes a contact portion thermally in contact with a base. The bonding pad is (i) spaced apart from the contact portion so as to be located on a side opposite from the contact portion so that a region to which laser light is applied from another laser element when the optical fiber is fixed to the bonding pad is sandwiched between the bonding pad and the base and (ii) separated spatially from the base.

4 Claims, 14 Drawing Sheets

(56) References Cited

FOREIGN PATENT DOCUMENTS

| JP | 01-306804 A | 12/1989 |
| JP | 01-310318 A | 12/1989 |
| JP | 02-308108 A | 12/1990 |
| JP | 2007-149932 A | 6/2007 |
| JP | 2007-256665 A | 10/2007 |
| JP | 2007-258479 A | 10/2007 |
| JP | 2007-258480 * | 10/2007 |
| JP | 2007-258480 A | 10/2007 |

OTHER PUBLICATIONS

Min-Ching Lin et al., "High-Power Laser Module with High Coupling Wedge-shaped Fiber", Opto-Electronics and Communications Conference, 2008 and the 2008 Australian Conference on Optical Fiber Technology, OECC/ACOFT 2008, Joint conference of the Volume, Issue, Jul. 7-10, 2008, pp. 1-2.

International Search Report issued May 31, 2011 in corresponding PCT Patent Application No. PCT/JP2011/057181.

* cited by examiner

|  | Thermal Conductivity (k) | Heat Resistance (°C/W) | Heat Conductance (W/°C) |
|---|---|---|---|
| Conventional Technique | 3 | $8.33 \times 10$ | $1.20 \times 10^{-2}$ |
| Present Invention | $\geq 90$ | $\leq 6 \times 10$ | $\geq 1.67 \times 10^{-2}$ |

FIG. 14

| Optical Fiber Supporting Member | Heat Resistance (×10 °C/W) | | | | | Heat Conductance (×10⁻² W/°C) | | | | | |
|---|---|---|---|---|---|---|---|---|---|---|---|
| | 90 (Ni) | 147 (Mo) | 160 (Si) | 200 (CuW, AlN) | Cu (400) | 90 (Ni) | 147 (Mo) | 160 (Si) | 200 (CuW, AlN) | Cu (400) |
| Configuration A | 7.22 | 4.42 | 4.06 | 3.25 | 1.63 | 1.38 | 2.26 | 2.46 | 3.08 | 6.15 |
| Configuration B | 8.89 | 5.44 | 5.00 | 4.00 | 2.00 | 1.12 | 1.84 | 2.00 | 2.50 | 5.00 |
| Configuration C | 11.4 | 6.97 | 6.41 | 5.13 | 2.56 | 0.877 | 1.43 | 1.56 | 1.95 | 3.90 |
| Configuration D | 26.0 | 15.9 | 14.6 | 11.7 | 5.85 | 0.385 | 0.628 | 0.684 | 0.855 | 1.71 |
| Configuration E | 4.07 | 2.49 | 2.29 | 1.83 | 0.917 | 2.45 | 4.01 | 4.36 | 5.45 | 10.9 |
| Configuration F | 4.35 | 4.10 | 4.06 | 3.99 | 3.84 | 2.30 | 2.44 | 2.46 | 2.51 | 2.61 |

LASER DEVICE AND METHOD FOR MANUFACTURING SAME

CROSS-REFERENCE TO RELATED APPLICATIONS

This application is a Continuation of PCT International Application No. PCT/JP2011/057181 filed in Japan on Mar. 24, 2011, which claims the benefit of Patent Application No. 2010-078967 filed in Japan on Mar. 30, 2010, the entire contents of which are hereby incorporated by reference.

TECHNICAL FIELD

The present invention relates to (i) a laser device obtained by combining a laser element such as a semiconductor laser element and an optical component such as an optical fiber, and (i) a method for manufacturing the laser device.

BACKGROUND ART

In recent years, a laser device which employs a laser element such as a semiconductor laser (LD; Laser Diode) element has been commercialized and is spreading in the field of optical communications. Examples of the laser device include a laser module obtained by combining a laser element and an optical fiber. For such a laser module, it is necessary to combine the laser element and the optical fiber so that optical coupling is achieved with a high optical coupling rate.

As such, in the laser module, it is important to align precisely (i) an output surface (surface via which laser light is outputted) of the laser element and (ii) a leading end portion of the optical fiber so that more of the laser light emitted from the laser element is introduced to the optical fiber. It is also important to keep the output surface of the laser element and the leading end portion of the optical fiber in alignment with each other.

As the laser module as described above, for example, a laser module described Patent Literature 1 has been known. In the laser module described in Patent Literature 1, a laser element (laser) and an optical fiber are provided on the same substrate. Specifically, the laser element is attached onto a laser submount which is fixed onto the substrate. Similarly, the optical fiber is attached onto a fiber submount (fiber supporting member) which is fixed onto the substrate.

In the laser module described in Patent Literature 1, the laser element and the optical fiber are attached by means of soldering onto the laser submount and the fiber submount, respectively, in a state where the laser element and the optical fiber are aligned with each other. This allows an output surface of the laser element and an leading end portion of the optical fiber to be in alignment with each other.

When the optical fiber is attached to the fiber submount by means of soldering as described above, it is necessary to not only increase a temperature of solder to a melting point or higher, but also sufficiently increase a temperature of the fiber submount, particularly a temperature of a solder fixation section to which the solder is applied so as to be spread. This is because the solder applied to the solder fixation section cannot be spread uniformly over the entire solder fixation section, in a case where the temperature of the solder fixation section is low.

In general, laser light outputted from a laser element spreads so that (i) a full width at half maximum (FWHM) of an angle of divergence in a longitudinal direction (direction perpendicular to an active layer of the laser element) of an output surface of the laser element is about 40° and (ii) a full width at half maximum of an angle of divergence in a lateral direction (direction parallel to the active layer of the laser element) of the output surface is about 10° (see, for example, Nonpatent Literatures 1 and 2). That is, the laser light spreads wider in the longitudinal direction than in the lateral direction.

As such, a technique as described in Nonpatent Literatures 1 and 2 has been generally practiced in which technique a leading end portion of an optical fiber is formed to have a wedge shape and is given a lens function, so that laser light which spreads widely in a longitudinal direction efficiently enters a core section of the optical fiber.

This makes it possible to prevent (i) undesirable application of laser light to around solder for attaching the optical fiber to the fiber submount, which laser light has been outputted from the laser element toward the core section of the optical fiber or (ii) undesirable introduction of the laser light to the clad section of the optical fiber, which laser light has been outputted from the laser element toward the core section of the optical fiber.

CITATION LIST

Patent Literature

Patent Literature 1
U.S. Pat. No. 6,758,610 [Publication Date: Jul. 6, 2004]

Nonpatent Literature

Nonpatent Literature 1
Xiaodong Zeng and Yuying An, Coupling light from a laser diode into a multimode fiber, APPLIED OPTICS, Optical Society of America, August 2003, Vol. 42, No. 22
Nonpatent Literature 2
Min-Ching Lin et al., High-Power Laser Module with High Coupling Wedge-Shaped Fiber, Opto-Electronics and Communications Conference, 2008 and the 2008 Australian Conference on Optical Fiber Technology, OECC/ACOFT 2008, Joint conference of the Volume, Issue, 7-10 Jul. 2008 Pages 1-2.

SUMMARY OF INVENTION

Technical Problem

The laser module described above in Patent Literature 1 has a problem that in a case where the fiber submount is made from a heat insulating material such as $ZrO_2$ or $Al_2O_3$, the temperature of the solder increases and, consequently, the solder itself melts or the optical fiber is heated so as to cause degradation in properties of the optical fiber.

Use of the heat insulating material as the fiber submount causes an increase in temperature of the solder for the following reason. That is, as described above, the laser light outputted from the laser element is not entirely introduced to the core section of the optical fiber. Part of the laser light is applied directly to the solder for attaching the optical fiber to the fiber submount, or is introduced to the clad section of the optical fiber.

The laser light applied directly to the solder causes the solder to generate heat. In a case where the fiber submount is made from a non heat insulating material, the heat generated at the solder is released to the substrate via the fiber submount. By contrast, in a case where the fiber submount is made from a heat insulating material, the heat is not released so fast, so that the heat generated at the solder stays in the fiber submount. This causes an increase in temperature of the solder. Further, the laser light introduced to the clad section leaks out of the clad so as to cause a metallic coating member of the optical fiber to generate heat. In a case where the fiber submount is made from the heat insulating material, the heat generated at the metallic coating member is conducted to the solder, and then stays in the solder without being conducted to the fiber submount. This causes an increase in temperature of the solder.

Specifically, it is considered that approximately 90% of an entire laser light outputted from the laser element is actually introduced to the core section of the optical fiber. As such, the rest of the laser light, i.e., approximately 10% of the laser light is applied directly to the solder or introduced to the clad section of the optical fiber.

Further, the laser element is expected to have an even higher output in the future, and an intensity of the laser light applied directly to the solder or introduced to the clad section of the optical fiber is on the rise, accordingly. Currently, the laser element already has an output of more than 10 W. In this case, laser light that is not introduced to the core section of the optical fiber is more than 1 W. As such, influence on the solder as described above cannot be ignored anymore.

The laser light that is applied directly to the solder without being introduced to the core section of the optical fiber, and the laser light that is introduced to the clad section of the optical fiber without being introduced to the core section of the optical fiber, each causes an increase in temperature of the solder. This causes (i) the solder to be melt and (ii) the optical fiber to be heated so as to have degradation in properties of the optical fiber, as described above. Even if the degradation in properties of the optical fiber does not occur, there is another concern that an excessive rise in temperature of the solder softens the solder and, accordingly, causes a change in position of the optical fiber. This phenomenon is particularly notable in a case where the position of the optical fiber shifts in a longitudinal direction of an output end surface of the laser element due to (i) angles of divergence, as described above, of light outputted from the laser element or (ii) a shape of a lens at the leading end portion of the optical fiber.

It is therefore very important in order to increase the output of the laser element that heat generated from the solder for attaching the optical be released efficiently.

In order to release efficiently the heat generated from the solder, it is effective that a non heat insulating material having a high thermal conductivity be used as the fiber submount in the laser module described in Patent Literature 1.

However, in a case where the non heat insulating material is simply used as the fiber submount, there is another problem that when the optical fiber is mounted to the fiber submount by use of the solder, the temperature of the solder fixation section of the fiber submount cannot be uniformly and sufficiently increased and, as a result, the solder applied to the solder fixation section of the fiber submount cannot be spread over the entire solder fixation section.

When the optical fiber is mounted to the fiber submount, soldering is carried out by heat which is generated by applying laser light from a laser light source separately provided for mounting the optical fiber. In a case where the fiber submount is made from the non heat insulating material, the heat generated through laser light application is released without staying in an upper surface (hereinafter referred to simply as "in a fiber submount surface) of the fiber submount on which upper surface the solder fixation section is provided. This inhibits (i) a sufficient increase in temperature in the fiber submount surface and (ii) a decrease in temperature gradient in the fiber submount surface.

The present invention is accomplished in view of the problem. An object of the present invention is to provide (i) a laser device which can achieve stability in (a) heat supply to a solder fixation section at the time of fixing an optical fiber to the solder fixation section and (b) heat release from the solder fixation section at the time of introducing laser light from a laser element to a core section of the optical fiber and which therefore has high mounting reliability, and (ii) a method for manufacturing the laser device.

Solution to Problem

In order to attain the object, a laser device in accordance with the present invention is a laser device including: a laser element having an output surface via which light is outputted; an optical fiber having a leading end portion which faces the output surface of the laser element; and a supporting member for supporting the optical fiber, the supporting member being made from a non heat insulating material and having a solder fixation section to which the optical fiber is fixed by use of solder, the supporting member including a contact portion which is thermally in contact with a heat releasing member, the solder fixation section (i) being spaced apart from the contact portion so as to be located on a side opposite from the contact portion so that a region to which laser light is applied from another laser element when the optical fiber is fixed to the solder fixation section is sandwiched between the solder fixation section and the contact portion and (ii) being separated spatially from the heat releasing member.

In the laser device, the non heat insulating material is used as the supporting member. This allows heat absorbed by the solder fixation section to be conducted efficiently from the solder fixation section to the contact portion when laser light is introduced from the laser element to the optical fiber.

As such, even in a case where (i) laser light that has not been introduced to a core section of the optical fiber out of the laser light outputted from the output surface of the laser element is applied directly to the solder, so that the solder generates heat and the solder fixation section starts absorbing the heat or (ii) laser light introduced to a clad section of the optical fiber is applied to a metallic coating member of the optical fiber, so that the metallic coating member generates heat and the solder fixation section starts absorbing the heat, it is possible to cause the heat to be released efficiently.

However, merely changing the supporting member from a heat insulating material to the non heat insulating material causes a problem that the solder applied to the solder fixation section cannot be spread over the entire solder fixation section, for the following reason. That is, when the laser light is applied so as to fix the optical fiber to the solder fixation section while melting the solder, there is a sharp heat gradient from a region, to which the laser light is applied, to the contact portion due to a significant increase in heat releasing efficiency of the supporting member, which increase is brought about by change from the heat insulating material to the non heat insulating material. The sharp heat gradient prevents a temperature of the solder fixation section from being increased sufficiently and uniformly.

As such, the laser device above employs a configuration in which the solder fixation section is spaced apart from the contact portion and is separated spatially from the heat releasing member.

Accordingly, by applying, at the time of fixing the optical fiber to the solder fixation section while melting the solder, laser light to a region (laser light application region; region sandwiched between the solder fixation section and the contact portion) which is spaced apart from the solder fixation section toward the contact portion, it is possible to cause heat conducted toward the solder fixation section out of heat generated from the laser light application region to stay within the supporting member, to which the solder fixation section, in a part of the supporting member which part extends from the laser light application region toward the solder fixation section. This allows the temperature of the solder fixation section to be increased sufficiently and uniformly. This is made possible for the following reason. That is, since the solder fixation section is located at a position opposite from the contact portion with respect to the laser light application region, it is less likely that there is a sharp temperature gradient. Consequently, the solder can be applied onto the solder fixation section more uniformly.

This makes it possible to stabilize (i) heat supply to the solder fixation section at the time of fixing the optical fiber to the solder fixation section and (ii) heat release from the solder fixation section at the time of introducing laser light from the laser element to the core section of the optical fiber. Accordingly, high mounting reliability can be achieved.

In order to achieve the object, a laser device in accordance with the present invention is a laser device including: a base; a laser element provided on the base; an optical fiber provided on the base; and a supporting member for supporting the optical fiber so that an end surface of the optical fiber faces an output surface of the laser element, the supporting member being made from a non heat insulating material, only one end section of the supporting member being thermally in contact with the base, the optical fiber being soldered to the other end section of the supporting member, the other end section being on a side opposite from the one end section.

According to the configuration, when the laser device is in use, heat generated at the solder can be quickly released to the base at the time of causing the laser light outputted from the semiconductor laser element to enter the leading end portion of the optical fiber. This is made possible for the following reason. That is, since the supporting member is made from the non heat insulating material, the heat generated at the solder is conducted from the other end section (end section to which the optical fiber is soldered) of the supporting member to the one end section (end section which is thermally in contact with the base) and then released from the one end section to the base.

At the same time, the configuration allows, when the laser device is manufactured, a temperature of the other end section (end section to which the optical fiber is soldered) of the supporting member to be increased uniformly and efficiently. As a result, the solder for causing the optical fiber to be soldered to the supporting member applied to the supporting member can be spread uniformly on the supporting member. This is made possible for the following reason. That is, in a case where laser light is applied to the region between the one end section and the other end section so as to heat the supporting member, heat conducted from the region toward the other end section stays in the other end section due to lack of a route for releasing, to the base, heat conducted from the region toward the other end section. The lack of the route for releasing the heat results from the fact that only the one end section of the supporting member is thermally in contact with the base (the other end section is not thermally in contact with the base).

That is, according to the configuration, it is possible to meet two opposite requirements of (1), when the laser device is manufactured, allowing the temperature of the other end section to be increased uniformly and efficiently at the time of soldering the optical fiber to the other end section of the supporting member and (2), when the laser device is in use, allowing heat generated at the solder to be released quickly to the base at the time of causing laser light outputted from the semiconductor laser element to enter the leading end portion of the optical fiber. This makes it possible to provide a laser device having mounting reliability better than that of a conventional laser device.

In order to attain the object, a method for manufacturing a laser device in accordance with the present invention is a method for manufacturing a laser device including a supporting member for supporting an optical fiber, the supporting member (i) being made from a non heat insulating material and (ii) including a solder fixation section to which the optical fiber is fixed by use of solder, the supporting member including a contact portion which is thermally in contact with a heat releasing member, the solder fixation section (i) being spaced apart from the contact portion so as to be located on a side opposite from the contact portion so that a laser light application region to which laser light is applied from a laser element when the optical fiber is fixed to the solder fixation section is sandwiched between the solder fixation section and the contact portion and (ii) being separated spatially from the heat releasing member, the method comprising: applying laser light to the laser light application region when the optical fiber is fixed to the solder fixation section by use of solder; and melting the solder by using an increase in temperature of the solder fixation section, which increase is caused by heat conducted from the laser light application region to a solder fixation section side.

According to the method for manufacturing the laser device, it is possible to apply laser light to a region (region sandwiched between the solder fixation section and the contact portion) which is spaced apart from the solder fixation section toward the contact portion, at the time of fixing the optical fiber to the solder fixation section while melting the solder.

Accordingly, by applying, at the time of fixing the optical fiber to the solder fixation section while melting the solder, laser light to a region (laser light application region) which is spaced apart from the solder fixation section toward the contact portion, it is possible to cause heat conducted toward the solder fixation section out of heat generated from the laser light application region to stay within the supporting member, to which the solder fixation section, in a part of the supporting member which part extends from the laser light application region toward the solder fixation section. This allows the temperature of the solder fixation section to be increased sufficiently and uniformly, so that the solder can be applied onto the solder fixation section more uniformly.

This makes it possible to stabilize (i) heat supply to the solder fixation section at the time of fixing the optical fiber to the solder fixation section and (ii) heat release from the solder fixation section at the time of introducing laser light from the laser element to the core section of the optical fiber. Accordingly, high mounting reliability can be achieved.

Advantageous Effects of Invention

A laser device in accordance with the present invention is a laser device including: a laser element having an output surface via which light is outputted; an optical fiber having a leading end portion which faces the output surface of the laser element; and a supporting member for supporting the optical fiber, the supporting member being made from a non heat insulating material and having a solder fixation section to which the optical fiber is fixed by use of solder, the supporting member including a contact portion which is thermally in contact with a heat releasing member, the solder fixation section (i) being spaced apart from the contact portion so as to be located on a side opposite from the contact portion so that a region to which laser light is applied from another laser element when the optical fiber is fixed to the solder fixation section is sandwiched between the solder fixation section and the contact portion and (ii) being separated spatially from the heat releasing member.

This makes it possible to provide (i) a laser device optical fiber which can stabilize (a) heat supply to the solder fixation section at the time of fixing the optical fiber to the solder fixation section and (b) heat release from the solder fixation section at the time of introducing laser light from the laser element to the core section of the optical fiber and which therefore has high mounting reliability; and (ii) a method for manufacturing the laser device.

BRIEF DESCRIPTION OF DRAWINGS

FIG. 1 is viewed from a Z-direction. (b) of FIG. 2 is a side view obtained when FIG. 1 is viewed from an X-direction. (c) of FIG. 2 is a side view obtained when FIG. 1 is viewed from a Y-direction.

FIG. 14 is a view showing a heat resistance and a heat conductance found in each of the optical fiber supporting members above (the optical fiber supporting member illustrated in FIG. 1, and the optical fiber supporting members in accordance with FIGS. 6, 8, and 10 through 13). The heat resistance and the heat conductance are found in each of the following cases: (i) an optical fiber support member is made from Ni, (ii) an optical fiber support member is made from Mo, (iii) an optical fiber support member is made from Si, (iv) an optical fiber support member is made from CuW (or MN), and (v) an optical fiber support member is made from Cu.

DESCRIPTION OF EMBODIMENTS

The following description will discuss one embodiment the present invention with reference to FIGS. 1 through 5.

(Laser Device 100)

Figure 1:
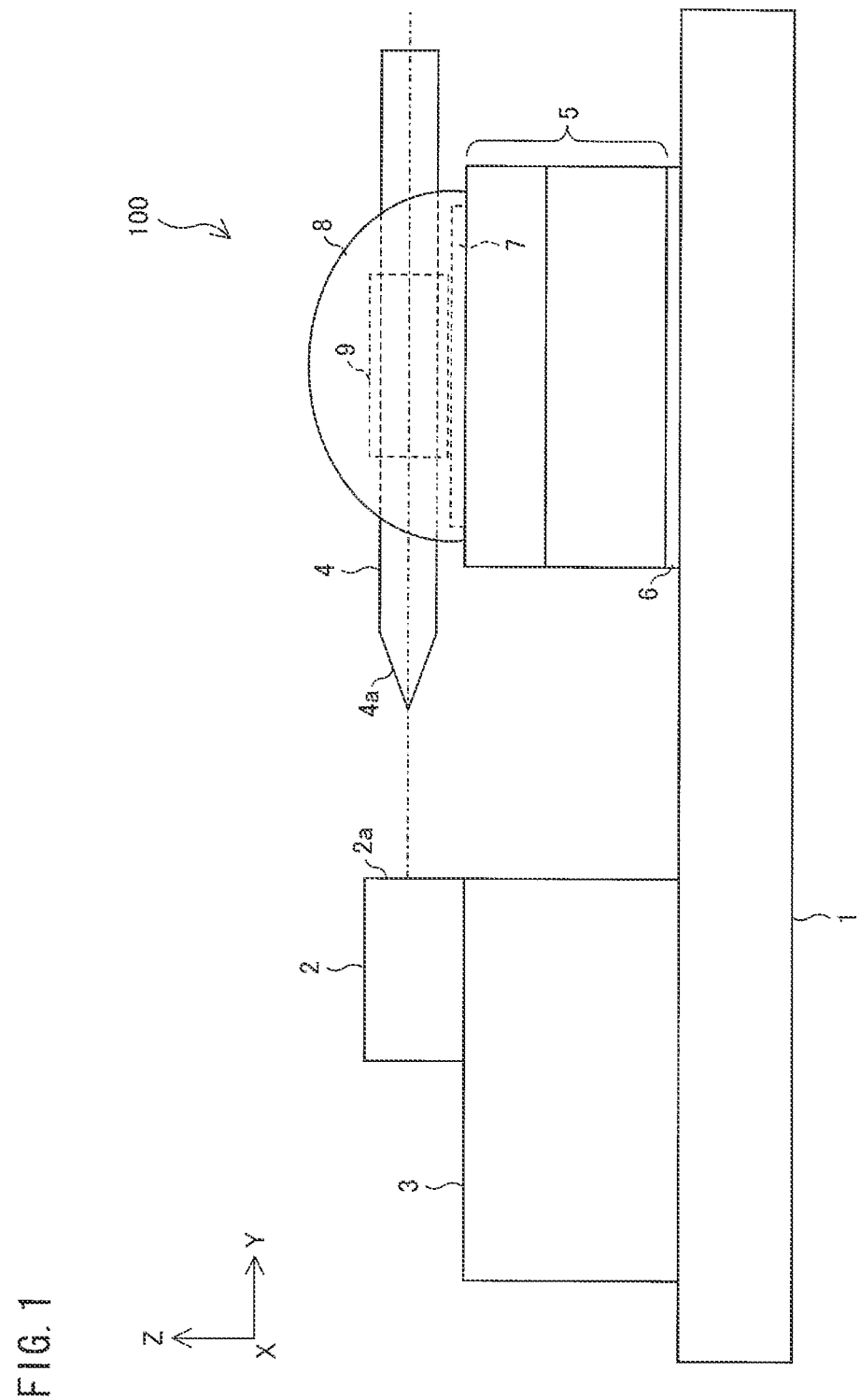
FIG. 1 is a schematic cross-sectional view illustrating a laser device in accordance with one embodiment of the present invention.
Figure 2:
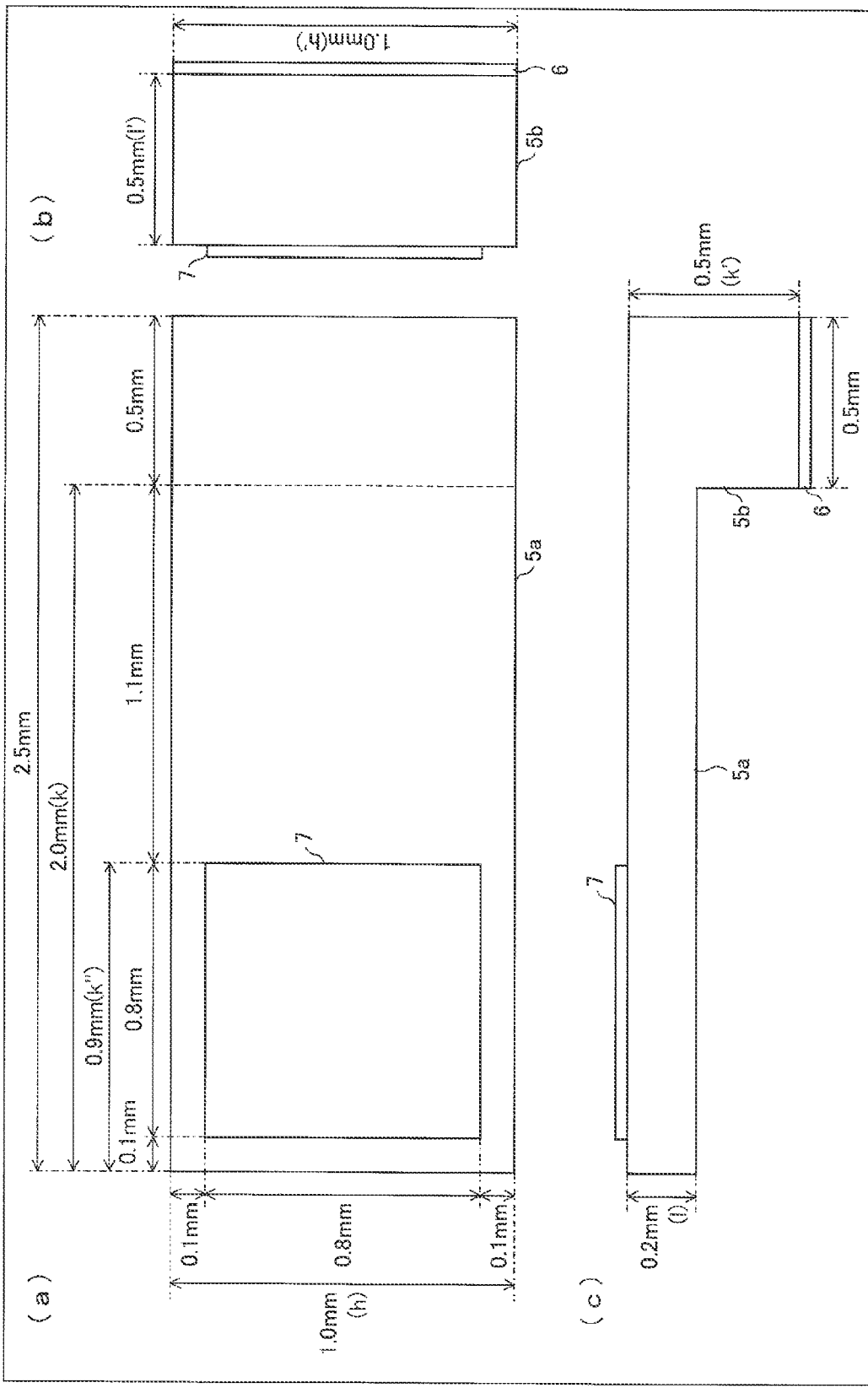
FIG. 2 is a trihedral drawing illustrating an optical fiber supporting member of the laser device illustrated in FIG. 1. (a) of FIG. 2 is a plan view obtained when

First, the following description will discuss, with reference to FIGS. 1 and 2, a configuration of a laser device 100 in accordance with one embodiment of the present invention. FIG. 1 is a schematic cross-sectional view illustrating the laser device 100 in accordance with the one embodiment of the present invention. FIG. 2 is a trihedral drawing illustrating an optical fiber supporting member 5 illustrated in FIG. 1. (a) of FIG. 2 is a plan view obtained when FIG. 1 is viewed from a Z-direction. (b) of FIG. 2 is a side view obtained when FIG. 1 is viewed from a X-direction. (c) of FIG. 2 is a side view obtained when FIG. 1 is viewed from a Y-direction.

As illustrated in FIGS. 1 and 2, the laser device 100 in the present embodiment includes a base (heat releasing member) 1, a semiconductor laser element (laser element) 2, a laser element supporting member 3, an optical fiber 4, an optical fiber supporting member (supporting member) 5, a bonding film 6, a bonding pad (solder fixation section) 7, a solder 8, and a metallic coating member 9.

The base 1 is, for example, a base having a rectangular parallelepiped shape. An encapsulating body (not shown) can be provided above the base 1, so that the encapsulating body and the base 1 constitute a package by encapsulating, between the encapsulating body and the base 1, the semiconductor laser element 2 and a leading end portion 4a of the optical fiber 4. In this case, the base 1 functions as a base plate of the package.

The laser element supporting member 3 and the optical fiber supporting member 5 are each bonded to the base 1, as described above. As such, heat which is generated at the semiconductor laser element 2 when laser generation is carried out is conducted to the base 1 via the laser element supporting member 3. Similarly, heat generated at the optical fiber 4 and heat generated at the bonding pad 7, which is described later, are also conducted to the base 1 via the optical fiber supporting member 5.

The base 1 is generally fixed onto a heat sink or a temperature adjustment block, so that heat conducted to the base 1 via the laser element supporting member 3 and the optical fiber supporting member 5 in this manner can be released. That is, the base 1 functions as a heat releasing member for releasing, to the heat sink or the temperature adjustment block, heat conducted from the laser element supporting member 3 and the optical fiber supporting member 5. The base 1 is generally made from copper in consideration of a heat-releasing property (heat-conducting property) and a manufacturing cost of the base 1.

The semiconductor laser element 2 is connected with a laser driving device (not shown), from which a drive current is supplied to the semiconductor laser element 2. The semiconductor laser element 2 has an output surface 2a, via which laser light is outputted. The output surface 2a faces the leading end portion 4a of the optical fiber 4. In response to the drive current supplied from the laser driving device, the semiconductor laser element 2 oscillates so as to output laser light from the output surface 2a. In the laser device 100 in accordance with the present embodiment, a multimode semiconductor laser element which outputs multimode light is employed as the semiconductor laser element 2. Examples of a semiconductor material constituting the multimode semiconductor laser element encompass InGaAs, AlGaAs, and InGaAsP.

As described in Background Art, laser light outputted from the output surface 2a of the semiconductor laser element 2 which outputs multimode light has an angle of divergence, a full width at half maximum (FWHM) of which in a Y-Z plane in FIG. 1 is about 40° and a full width at half maximum of which in a X-Y plane in FIG. 1 is about 10°. That is, the laser light of the semiconductor laser element 2 spreads wider in the Y-Z plane than in the X-Y plane.

Note that in FIG. 1, the Y-Z plane is a plane that is parallel to a plane in which an active layer of the semiconductor laser element 2 extends, out of planes perpendicular to the output surface 2a of the semiconductor laser element 2. The X-Y plane is a plane that is perpendicular to the plane in which the active layer of the semiconductor laser element 2 extends, out of planes that are perpendicular to the output surface 2a.

This means that in terms of aligning the output surface 2a of the semiconductor laser element 2 with the leading end portion 4a of the optical fiber 4, an optical coupling rate (described later) of the semiconductor laser element 2 and the optical fiber 4 is decreased more in a case where displacement in position of the optical fiber 4 with respect to the output surface of the semiconductor laser element 2 occurs in a Z-axis direction than in a case where the displacement occurs in an X-axis direction.

This is because the laser light of the semiconductor laser element 2 spreads wider in the Y-Z plane as described above, so that in a case where displacement in position of the optical fiber 4 occurs in the Z-axis direction, more of the laser light fails to be introduced to the core section of the optical fiber 4 as compared with a case in which the displacement in position of the optical fiber 4 occurs in the X-axis direction.

That is, fluctuations of the optical coupling rate of the semiconductor laser element 2 and the optical fiber 4 is insensitive to displacement in position of the optical fiber 4 in the X-axis direction, but is very sensitive to displacement in position of the optical fiber 4 in the Z-axis direction.

For example, displacement in position of the optical fiber 4 in the X-axis direction is allowed up to about 10 μm, whereas displacement in position of the optical fiber 4 in the Z-direction on the output surface 2a of the semiconductor laser element 2 is allowed only up to about 1 μm to 3 μm, though allowable displacement depends on a level of a lens function of the leading end portion 4a of the optical fiber 4.

A lower surface of the laser element supporting member 3 is bonded to the base 1. On the upper surface of the laser element supporting member 3, the semiconductor laser element 2 is provided. That is, the laser element supporting member 3 supports the semiconductor laser element 2 so that the semiconductor laser element 2 is provided at a specific position above the base 1.

The laser element supporting member 3 has a function of conducting, to the base 1, heat which is generated when the semiconductor laser element 2 outputs laser light. The heat generated at the semiconductor laser element 2 is released to the atmosphere via the base 1 (or via the heat sink or the temperature adjustment block attached to the base 1). This suppresses a rise in temperature of the semiconductor laser element 2 at the time of laser generation. As a result, the semiconductor laser element 2 oscillates stably. Examples of a material constituting the laser element supporting member 3 encompass copper tungsten (CuW), molybdenum (Mo), and aluminum nitride (AlN).

The optical fiber 4 is provided for the purpose of guiding, to the outside of the laser device 100, laser light outputted from the semiconductor laser element 2. The laser light outputted from the semiconductor laser element 2 is introduced into the optical fiber 4 via the leading end portion 4a of the optical fiber 4.

As illustrated in FIG. 1, the leading end portion 4a of the optical fiber 4 has a wedge shape, and a ridgeline of the leading end portion 4a extends in the X-axis direction.

As described above, laser light of the semiconductor laser element 2 spreads wider in the Y-Z plane than in the X-Y plane. As such, at the leading end portion 4a of the optical fiber 4, into which the laser light enters, it is necessary that the laser light outputted from the output surface 2a of the semiconductor laser element 2 so as to spread in the Y-Z plane be refracted so as to be guided to the core section of the optical fiber 4.

As such, the optical fiber 4 is processed so that (i) the leading end portion 4a of the optical fiber 4 has a wedge shape and (ii) is imparted a lens function. Laser light which has been outputted from the output surface 2a of the semiconductor laser element 2 so as to spread in the Y-Z plane is refracted when the laser light enters the leading end portion 4a, which has been given a lens function and has a wedge shape. The laser light is then introduced to the core section of the optical fiber 4.

As illustrated in FIG. 1, the leading end portion 4a of the optical fiber 4 is arranged so as to face the output surface 2a of the semiconductor laser element 2. The output surface 2a of the semiconductor laser element 2 and the leading end portion 4a of the optical fiber 4 are aligned with each other so that as large a portion as possible of laser light outputted from the semiconductor laser element 2 is introduced to the core section of the optical fiber 4. That is, the output surface 2a of the semiconductor laser element 2 and the leading end portion 4a of the optical fiber 4 are aligned with each other so that the optical coupling rate of the semiconductor laser element 2 and the optical fiber 4 becomes a maximum value.

The optical fiber 4 can have a known triple structure which is constituted by, for example, a core section, a clad section provided on an outer side of the core section, and a covering section for covering the core section and the clad section. Alignment of the output surface 2a of the semiconductor laser element 2 and the leading end portion 4a of the optical fiber 4 as described above specifically means that an optical axis of laser light outputted from the semiconductor laser element 2 and an optical axis of the core section of the optical fiber 4 are aligned with each other so that as large a portion as possible of laser light outputted from the semiconductor laser element 2 is introduced to the core section of the optical fiber 4. The optical fiber 4 can be a multimode fiber which is capable of optically coupled with the semiconductor laser element 2, which is a multimode semiconductor laser element as described above. The optical fiber 4 can have a core diameter and a clad diameter of, for example, 100 μm and 125 μm, respectively.

A lower surface of the optical fiber supporting member 5 is bonded to the base 1 so that the bonding film 6 is sandwiched between the lower surface and the base 1. On an upper surface of the optical fiber supporting member 5, the optical fiber 4 is provided so that the bonding pad 7 is sandwiched between the upper surface and the optical fiber 4. The optical fiber supporting member 5 supports the leading end portion 4a of the optical fiber 4 so that the leading end portion 4a of the optical fiber 4 is provided at a specific position above the base 1.

The optical fiber supporting member 5 is made from a non heat insulating material having a high thermal conductivity. The optical fiber supporting member 5 can be made from a non heat insulating material having a high thermal conductivity, for example, nickel (Ni), molybdenum (Mo), silicon (Si), copper tungsten (CuW), aluminum nitride (AlN), copper (Cu), or the like. For example, the non heat insulating materials as listed above have thermal conductivities of 90 W/m·° C. (Ni), 147 W/m·° C. (Mo), 160 W/m·° C. (Si), 200 W/m·° C. (CuW, AlN), and 400 W/m·° C. (Cu), respectively. Other non heat insulating materials which can be used are, for example, Ni-ceramic, silicon carbide (SiC, 257 W/m·° C.), beryllium oxide (BeO, 285 W/m·° C.), cubic boron nitride (1300 W/m·K), diamond (2200 W/m·° C.). Each of the other non heat insulating materials preferably has a thermal conductivity of not lower than 50 W/m·° C. Examples of heat insulating materials having a low thermal conductivity as opposed to the non heat insulating materials encompass silica (1 W/m·° C.), Macor (2 W/m·° C.), and Zirconia (3 W/m·° C.).

Due to being made from the non heat insulating material having a high thermal conductivity as described above, the optical fiber supporting member 5 is capable of efficiently conducting, to the base 1, heat which is generated when laser light is caused to enter the optical fiber 4.

As a matter of course, the non heat insulating material from which the optical fiber supporting member 5 is made from is not limited to the materials as described above. In short, the optical fiber supporting member 5 can be made from a non heat insulating material that has a thermal conductivity higher than that of a heat insulating material such as glass which has an extremely low thermal conductivity.

The heat generated when the laser light is caused to enter the optical fiber 4 is released via the base 1. This suppresses a rise in temperature of the optical fiber 4 when the laser light is conducted. Consequently, arrangement of the optical fiber 4 is maintained stably.

As described later, laser light that is directly applied to the solder 8 out of the laser light outputted from the laser element 2 causes the solder 8 to generate heat. In addition, laser light that is introduced to the clad section of the optical fiber 4 out of the laser light outputted from the laser element 2 leaks out of the clad section and causes the metallic coating member 9 (described later) to generate heat. The heat generated from the solder 8 and the heat generated from the metallic coating member 9 are absorbed by the bonding pad 7 for fixing the optical fiber 4, and then released from the base 1 via the optical fiber supporting member 5.

As illustrated in FIG. 2, the optical fiber supporting member 5 is constituted by (i) a beam section (flat plate section) 5a having the upper surface on which the optical fiber 4 is provided and (ii) a column section (maintaining section) 5b having the lower surface bonded to the base 1. The column section 5b is provided so as to be connected with the beam section 5a at one of end sections of the beam section 5a which end sections extend along a lateral direction of the beam section 5a. Although the beam section 5a and the column section 5b are integrally molded, the following description will discuss the optical fiber supporting member 5 by dividing the optical fiber supporting member 5 into two parts, i.e., the beam section 5a and the column section 5b, for easy explanation.

The beam section 5a has a platelike shape, and the column section 5b has a rectangular parallelepiped shape. As such, as illustrated in (c) of FIG. 2, the optical fiber supporting member 5 has an L-shaped side surface when viewed from the Y-axis direction of FIG. 1. This structure of the optical fiber supporting member 5 with the L-shaped side surface is called "cantilever structure" in the Description.

It is of course possible to mold the beam section 5a and the column section 5b separately and then integrate the beam section 5a and the column section 5b with each other so as to form an L shape as described above, instead of integrally molding the beam section 5a and the column section 5b. Note that in this case, it is desirable that the beam section 5a and the column section 5b be integrated so that heat conduction between the beam section 5a and the column section 5b is not obstructed.

The column section 5b has the lower surface which is bonded to the base 1. The bonding film 6 is sandwiched between the lower surface of the column section 5b and the base 1. The bonding film 6 is provided for the purpose of attaching the column section 5b to the base 1, and can be a two-layer structure film made up of, for example, a Ni film (upper layer) and a Au film (lower layer). Employing the two-layer structure film as the bonding film 6 allows (i) the heat absorbed by the bonding pad 7 as described above to be efficiently conducted to the base 1 and (ii) the column section 5b to be attached to the base 1 reliably.

On the other hand, the beam section 5a has the upper surface on which the optical fiber 4 is provided. The bonding pad 7 is sandwiched between the upper surface of the beam section 5a and the optical fiber 4. The bonding pad 7 is provided for the purpose of attaching the optical fiber 4 to the upper surface of the beam section 5a. Like the bonding film 6, the bonding pad 7 can be a two-layer structure film made up of, for example, a Ni film (upper layer) and a Au film (lower layer). Employing the two-layer structure film as the bonding pad 7 allows (i) the heat absorbed by the bonding pad 7 as described above to be efficiently conducted to the beam section 5a and (ii) the optical fiber 4 to be attached to the beam section 5a reliably.

Further, when the optical fiber 4 is provided on the upper surface of the beam section 5a, the optical fiber 4 is fixed to the bonding pad 7 of the beam section 5a by means of the solder 8. The solder 8 can be, for example, a solder having a low melting point of about 100° C. to 200° C. or a eutectic solder. More specifically, the solder 8 can be a eutectic solder constituted by 63% tin (Sn) and 37% lead (Pb), an indium (In) alloy solder, a tin (Sn)-silver (Ag) solder, or the like. For example, the solder 8 can be a eutectic solder constituted by 80% gold (Au) and 20% tin (Sn), a eutectic solder constituted by 10% gold (Au) and 90% tin (Sn), a eutectic solder constituted by 96.85% gold (Au) and 3.15% silicon (Si), or a eutectic solder constituted by 88% gold (Au) and 12% germanium (Ge). The solder 8 is preferably the eutectic solder constituted by 80% gold (Au) and 20% tin (Sn). A melting point of each of these solders is preferably within a range of 200° C. to 400° C., more preferably within a range of 100° C. to 400° C.

As illustrated in FIG. 1, the metallic coating member 9 is provided around a part of the optical fiber 4 so as to surround the optical fiber 4. The metallic coating member 9 is preferably present between the optical fiber 4 and the solder 8 when the optical fiber 4 and the bonding pad 7 are bonded to each other by use of the solder 8.

This is because the optical fiber 4 is made of glass and therefore is unsuitable for bonding to the solder. Further, the optical fiber 4 is generally covered with resin on the outside so as to protect the core section and the clad section from mechanical disturbance and chemical disturbance. However, this covering is also unsuitable for bonding with the solder and for formation of the metallic coating member 9. In view of the above, it is preferable that the metallic coating member 9 be provided directly on the periphery of the clad section of the optical fiber 4.

As such, in the present embodiment, the metallic coating member 9 as described above is separately provided, and the optical fiber 4 and the solder 8 are bonded to each other via the metallic coating member 9.

(Optical Fiber Supporting Member 5)

The following description will discuss in further detail a configuration of the optical fiber supporting member 5 and an effect provided by the configuration.

Figure 3:
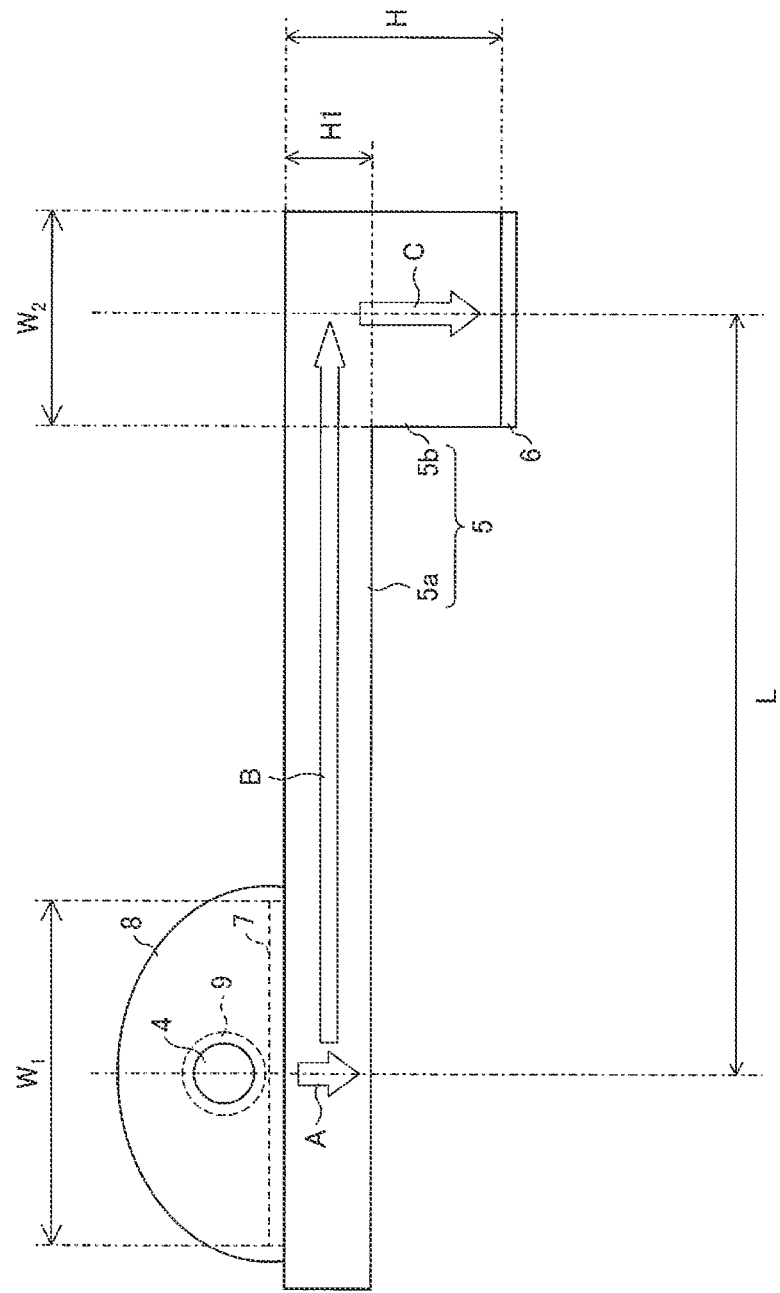
FIG. 3 is a view illustrating the optical fiber supporting member of the laser device illustrated in FIG. 1 and a peripheral part of the optical fiber supporting member.

FIG. 3 is a view illustrating the optical fiber supporting member 5 illustrated in FIGS. 1 and 2 and peripheral parts of the optical fiber supporting member 5. In FIG. 3, the optical fiber supporting member 5 is constituted by the beam section 5a and the column section 5b, as described above.

Specifically, the beam section 5a includes one main surface (first main surface, upper surface) on which the bonding pad 7, to which the optical fiber 4 is fixed by means of the solder 8, is provided, and the other main surface (second main surface, lower surface) which is opposite to the one main surface. As described above, the beam section 5a has a platelike shape and is connected with the column section 5b at one of the end sections of the beam section 5a which end sections extend along the lateral direction of the beam section 5a. The other main surface (lower surface) of the beam section 5a faces the base 1. Here, the "main surface" refers to two surfaces that have the largest area among six surfaces constituting a platelike object. Note that the main surface is sometimes called "upper surface" or "lower surface," and a surface other the main surface is sometimes called "side surface."

As described above, a lower end of the column section 5b is fixed onto the base 1. An upper end of the column section 5b is connected with the beam section 5a at one of the end sections of the beam section 5a which end sections extend along the lateral direction of the beam section 5a. In this manner, the column section 5b causes the other main surface (lower surface) of the beam section 5a and the base 1 to face each other while being spaced part from each other. In other words, the beam section 5a is provided above the base 1 so as to maintain a space between the beam section 5a and the base 1.

The column section 5b releases, to the base 1, heat conducted from the beam section 5a to the column section 5b. As described above, the column section 5b is fixed onto the base 1, and heat conducted from the beam section 5a and the column section 5b is released to the base 1 via a portion (contact portion) where the column section 5b is fixed to the base 1. As such, the column section 5b is thermally in contact with the base 1 at the portion where the column section 5b is fixed to the base 1.

Further, each of the beam section 5a and the column section 5b is made from a non heat insulating material having a high thermal conductivity, as described above.

The optical fiber supporting member 5 which is constituted by the beam section 5a and the column section 5b, which are connected with each other, and is made from a non heat insulating material is arranged such that, first, a thickness of the optical fiber supporting member 5 measured under the bonding pad 7, to which the optical fiber 4 is attached (i.e., a thickness of the beam section 5a), is H1, which is a value lower than a height H of the optical fiber 4 measured by use of the base 1 as a reference level (this configuration is hereinafter called "configuration 1"). Note that a thickness of the bonding film 6 and a thickness of the bonding pad 7 are not taken into consideration here, so that the height of the optical fiber 4 is determined solely on the basis of a thickness of the optical fiber supporting member 5.

Next, the bonding pad 7 and the column section 5b are spaced apart from each other (this configuration is hereinafter called "configuration 2"). In FIG. 3, for example, a distance L is given between a center line of the bonding pad 7 and a center line of the column section 5b, so that the bonding pad 7 and the column section 5b are spaced apart from each other. As is clear from FIG. 3, an inequality: $L > (W1+W2)/2$ is met where W1 is a width of the bonding pad 7 (width along a direction perpendicular to a longitudinal direction of the optical fiber 4) and W2 is a width of the column section 5b (width along a direction perpendicular to the longitudinal direction of the optical fiber 4).

First, in the configuration 1, the thickness H1 of the optical fiber supporting member 5 under the bonding pad 7 is smaller than the height H, which is necessary in order to cause the leading end portion 4a of the optical fiber 4 to be optically coupled to the output surface 2a of the semiconductor laser element 2.

That is, the optical fiber supporting member 5 causes the beam section 5a and the base 1 to be spaced apart under the bonding pad 7 so as to maintain the space between the beam section 5a and the base 1, while aligning the leading end portion 4a of the optical fiber 4 and the output surface 2a of the semiconductor laser element 2 with each other.

Further, in the configuration 2, the optical fiber supporting member 5 causes (i) the bonding pad 7, which conducts, to the beam section 5a, heat generated when laser light outputted from the semiconductor laser element 2 is caused to enter the leading end portion 4a of the optical fiber 4 and (ii) the column section 5b fixed onto the base 1 to be spaced apart from each other by the distance L.

That is, the optical fiber supporting member 5 causes the bonding pad 7 and the column section 5b, which causes heat conducted through the beam section 5a to be released to the base 1, to be spaced apart from each other by the distance L.

Due to having the two configurations 1 and 2 as described above, the optical fiber supporting member 5 can stabilize (1) supplying heat to the bonding pad 7 at the time of fixing the optical fiber 4 to the bonding pad 7 while melting the solder 8 and (2) releasing heat from the bonding pad 7 at the time of introducing laser light from the semiconductor laser element 2 to the core section of the optical fiber 4. That is, the optical fiber supporting member 5 can meet two opposite requirements of (1), when the laser device 100 is manufactured, allowing a temperature around the bonding pad 7 to be increased uniformly and sufficiently at the time of fixing the optical fiber 4 to the bonding pad 7 while melting the solder 8 and (2), when the laser device 100 is in use, allowing heat conducted from the solder 8 to the bonding pad 7 to be released quickly to the base 1 at the time of causing laser light outputted from the semiconductor laser element 2 to enter the leading end portion 4a of the optical fiber 4.

Figures 4, 5:
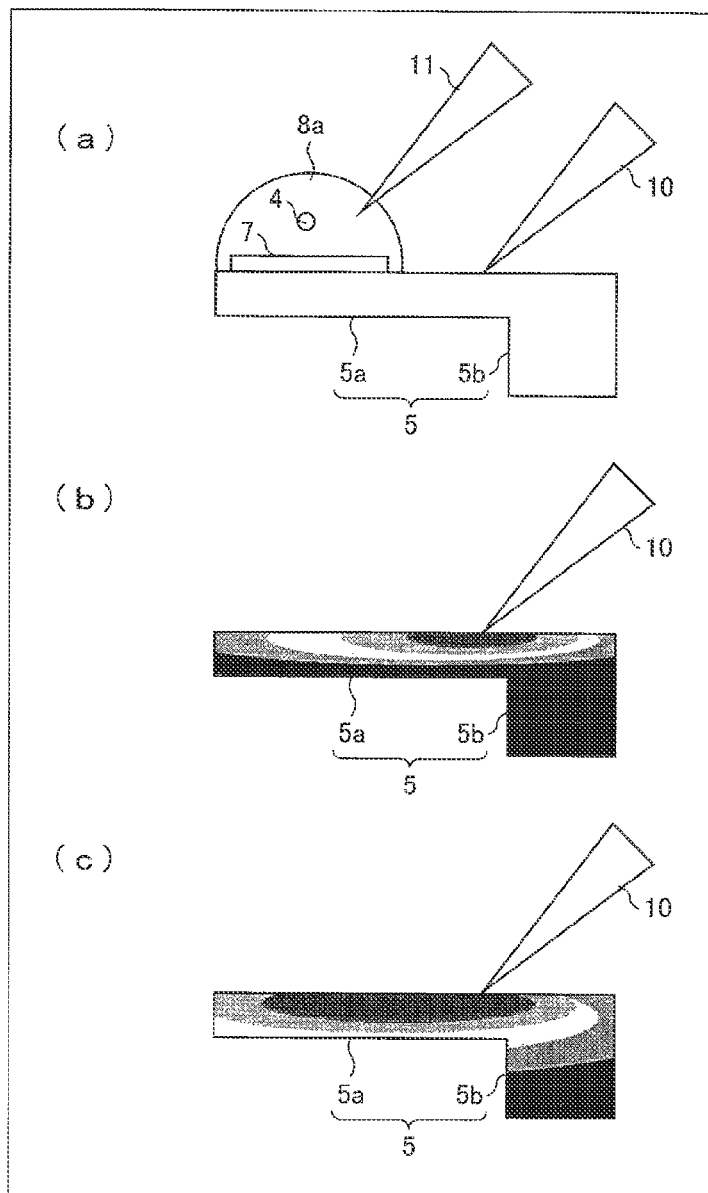
FIG. 4 is a table comparing (i) thermal conductivity, heat resistance, and heat conductance of the optical fiber supporting member of the laser device illustrated in FIG. 1 and (ii) thermal conductivity, heat resistance, and heat conductance of an optical fiber supporting member of a conventional laser device.
FIG. 5 is a view illustrating a situation where an optical fiber is fixed, by use of solder, to a bonding pad of the optical fiber supporting member of the laser device illustrated in FIG. 1. (a) of FIG. 5 is a view illustrating a situation where the solder has been melt by means of application of laser light for melting the solder to the optical fiber supporting member. (b) of FIG. 5 is a view illustrating heat distribution (temperature distribution) in an optical fiber supporting member which is made from a heat insulating material having a thermal conductivity of 3 W/m·°C. (c) of FIG. 5 is a view illustrating heat distribution (temperature distribution) in an optical fiber supporting member which is made from a non heat insulating material having a thermal conductivity of not lower than 90 W/m·°C.

First, the following description will discuss, with reference to FIGS. 3 and 4, why the heat which has been conducted from the solder 8 to the bonding pad 7 can be quickly released to the base 1 when the laser light outputted from the semiconductor laser element 2 is caused to enter the leading end portion 4a of the optical fiber 4.

The heat generated at the solder 8 when the laser light outputted from the semiconductor laser element 2 is caused to enter the leading end portion 4a of the optical fiber 4 is first conducted to the bonding pad 7. The heat conducted to the bonding pad 7 is then conducted into the beam section 5a along the arrow A in FIG. 3, and subsequently conducted from the beam section 5a to the column section 5b efficiently along the arrow B in FIG. 3.

As described above, the heat absorbed by the bonding pad 7 can be efficiently conducted to the column section 5b because the beam section 5a made from a non heat insulating material and the column section 5b made from a non heat insulating material are provided between the bonding pad 7 and the column section 5b which is fixed to the base 1 having a heat releasing function, more specifically between the bonding pad 7 and the portion where the column section 5b is fixed to the base 1.

Here, in a case where the beam section 5a and the column section 5b are each made from a non heat insulating material having a thermal conductivity of not lower than 90 W/m·° C. as shown by the item "present invention" in FIG. 4, heat resistance from an end of the bonding pad 7 of the beam section 5a, which end is close to the base 1, to the portion where the column section 5b is fixed to the base 1 is not higher than $6\times10^\circ$ C./W. In other words, heat conductance from the end of the bonding pad 7 of the beam section 5a, which end is close to the base 1, to the portion where the column section 5b is fixed to the base 1 is not lower than $1.67\times10^{-2}$ W/° C. The heat resistance and the heat conductance can be calculated, for example, in the following manner. In a case of the optical fiber supporting member 5 as illustrated in FIG. 2, the beam section 5a has a width h of 1 mm, a length k of 2 mm, and a height (thickness) l of 0.2 mm. The column section 5b has a width h" of 1 mm, a length k" of 0.5 mm, and a height (thickness) 1" of 0.5 mm. Here, in a case where the material of the optical fiber supporting member is Mo (thermal conductivity K=147 W/m·° C.), heat resistance between the bonding pad 7 provided on the one main surface of the beam section 5a and the portion where the column section 5b is fixed to the base 1 can be expressed by the following formula.

$$((k-k")/(h\times l)+l'/(h'\times k'))/\kappa \qquad (1)$$

Heat conductance between the bonding pad 7 provided on the one main surface of the beam section 5a and the portion where the column section 5b is fixed to the base 1 can be represented by a reciprocal of the heat resistance found by Formula (I).

In Formula (I), heat resistance between (i) the end of the bonding pad 7 which end is close to the base 1 and (ii) the portion where the column section 5b is fixed to the base 1 is calculated. This is done so as to make a simplest assumption about a flow of heat released from the bonding pad 7 to the portion.

On the other hand, in a case where each of the beam section 5a and the column section 5b is made from a heat insulating material having a thermal conductivity of 3 W/m·° C. as shown by the item "conventional technique" in FIG. 4, each of the beam section 5a and the column section 5b has a heat resistance of $8.33\times10^\circ$ C./W. In other words, each of the beam section 5a and the column section 5b has a heat conductance of $1.20\times10^{-2}$ W/° C.

Thus, in the case where each of the beam section 5a and the column section 5b is made from the non heat insulating material having the thermal conductivity of not lower than 90 W/m·° C. as shown by the item "present invention" in FIG. 4, the heat resistance of each of the beam section 5a and the column section 5b significantly decreases as compared with the case as shown by the item "conventional technique" in FIG. 4. In this case, efficient heat conduction from the beam section 5a to the column section 5b.

In this manner, stable heat release is achieved when the laser light outputted from the semiconductor laser element 2 is caused to enter the leading end portion 4a of the optical fiber 4.

Next, the following description will discuss, with reference to FIG. 5, why the temperature around the bonding pad 7 can be increased uniformly and sufficiently at the time of fixing the optical fiber 4 to the bonding pad 7 while melting the solder 8.

At the time of fixing the optical fiber 4 to the bonding pad 7 while melting the solder 8, heat for melting the solder 8 is supplied from outside the laser device 100 by applying laser light from a laser light source which is provided outside the laser device 100. That is, as illustrated in (a) of FIG. 5, laser light 11 from the laser light source provided outside the laser device 100 is applied to the solder 8 so as to heat the solder 8, and laser light 10 from the laser light source provided outside the laser device 100 is applied to the beam section 5a so as to heat the beam section 5a. Here, the beam section 5a is heated for the purpose of causing the temperature around the bonding pad 7 to increase uniformly and sufficiently so that the solder 8 is applied to the entire bonding pad 7 so as to spread over the entire bonding pad 7. Note that it is possible to omit directly heating the solder 8 by means of the laser light 11 in a case where the solder 8 can be melted solely by heating the beam section 5a by means of the laser light 10.

In the optical fiber supporting member 5, the bonding pad 7 and the column section 5b are spaced apart from each other by the distance L, as described above. As such, as illustrated in (a) of FIG. 5, the laser light 10 for heating the beam section 5b can be applied between the bonding pad 7 and the column section 5b.

In a case where each of the beam section 5a and the column section 5b is made from a heat insulating material (e.g., the heat insulating material having the thermal conductivity of 3 W/m·° C. as shown by the item "conventional technique" in FIG. 4), heat generated at a position where the laser light 10 is applied (laser light 10 application position) is not efficiently conducted in the beam section 5a due to a low heat-conducting property of the beam section 5a.

As such, as illustrated in (b) of FIG. 5, the temperature of the beam section 5a decreases sharply as a distance between a position and the laser light 10 application position is applied increases. That is, the temperature around the bonding pad 7 cannot be uniformly and sufficiently increased at the time of fixing the optical fiber 4 to the bonding pad 7. As a result, the solder 8 cannot be applied and spread uniformly around the bonding pad 7.

On the other hand, in a case where each of the beam section 5a and the column section 5b is made from a non heat insulating material (e.g., the non heat insulating material having the thermal conductivity of not lower than 90 W/m·° C. as shown by the item "present invention" in FIG. 4), as illustrated in (c) of FIG. 5, heat generated from the laser light 10 application position (laser light application position) is conducted efficiently in the beam section 5a due to a high heat-conducting property of the beam section 5a.

This causes a temperature gradient in the beam section 5a to be small, as illustrated in (c) of FIG. 5. That is, it is possible to cause the temperature around the bonding pad 7 to increase uniformly and efficiently at the time of fixing the optical fiber 4 to the bonding pad 7. This allows the solder 8 to be applied and spread uniformly around the bonding pad 7.

In particular, a part of the beam section 5a which part is closer to the bonding pad 7 than the laser light 10 application position has a temperature gradient smaller than that of a part of the mean section 5a which part is closer to the column section 5b than the laser light 10 application position. This is because heat conducted from the laser light 10 application section toward the column section 5b is released to the base 1 via the column section 5b whereas heat conducted from the laser light 10 application section toward the bonding pad 7 stays within the beam section 5a due to lack of a route for releasing the heat, which lack results from the fact that the beam section 5a is spaced apart from the base 1.

As described above, it is possible to supply heat to the bonding pad 7 stably at the time of fixing the optical fiber 4 to the bonding pad 7.

Note that, as illustrated in (a) of FIG. 5, it is possible to accelerate melting the solder 8a by applying the laser light 11 to the solder 8a directly from the laser light source which is provided outside the laser device 100, at the time of fixing the optical fiber 4 to the bonding pad 7 while melting the solder 8a.

For example, an output of the laser light 10 can be 27 W, and an output of the laser light 11 can be 8 W. Note, however, that it is preferable that the output of the laser light 11, which is directly applied to the solder 8a, be set so as not to increase a temperature of the solder to the extent of causing the solder 8a to change in quality.

As described above, according to the laser device 100 in accordance with the present embodiment, even in a case where the solder 8 for fixing the optical fiber 4 generates heat due to application of laser light that is not introduced to the core section of the optical fiber 4 out of the laser light outputted from the output surface 2a of the semiconductor laser element 2, it is possible to cause the heat to be conducted efficiently to the base 1. Consequently, heat from the bonding pad 7 can be efficiently released. This makes it possible to prevent (i) the solder 8 itself from melting, (ii) the optical fiber 4 from being heated with the heat generated from the solder 8, and (iii) the optical fiber 4 from having deteriorated properties due to being heated.

Further, at the time of fixing the optical fiber 4 to the bonding pad 7 while melting the solder 8, the temperature around the bonding pad 7 can be increased uniformly and efficiently. This allows the solder 8a to be applied uniformly onto the bonding pad 7.

Thus, according to the laser device 100 in the present embodiment, it is possible to meet two opposite requirements of (1) allowing heat conducted from the solder 8 to the bonding pad 7 to be released quickly to the base 1 when laser light outputted from the semiconductor laser element 2 is caused to enter the leading end portion 4a of the optical fiber 4 and (2) allowing a temperature around the bonding pad 7 to be increased uniformly and sufficiently when the optical fiber 4 is fixed to the bonding pad 7 while the solder 8 is melted. This makes it possible to achieve high mounting reliability.

Modified Example 1

Figure 6:
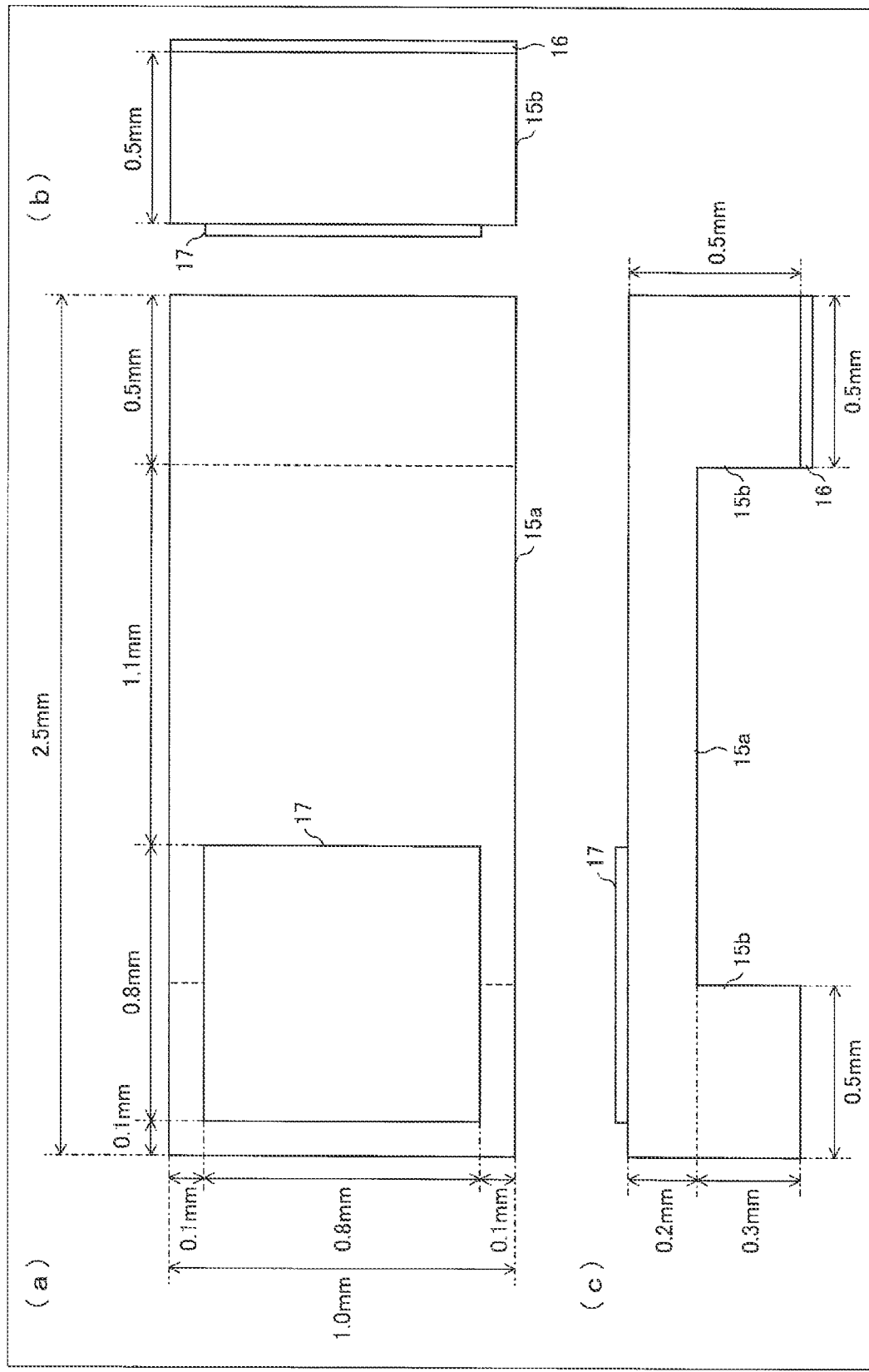
FIG. 6 is a trihedral drawing illustrating a modified example of the optical fiber supporting member of the laser device illustrated in FIG. 1. (a) of FIG. 6 is a plan view obtained when the modified example is viewed from the Z-direction of FIG. 1. (b) of FIG. 6 is a side view obtained when the modified example is viewed from the X-direction of FIG. 1. (c) of FIG. 6 is a side view obtained when the modified example is viewed from the Y-direction of FIG. 1.

FIG. 6 schematically illustrates a configuration of Modified Example 1 of the optical fiber supporting member of the laser device 100 in accordance with the one embodiment as described above. FIG. 6 is a trihedral drawing illustrating Modified Example 1 of the optical fiber supporting member 5 illustrated in FIG. 1. (a) of FIG. 6 is a plan view of Modified Example 1, which plan view is obtained when Modified Example 1 is viewed from the Z-direction of FIG. 1. (b) of FIG. 6 is a side view of Modified Example 1, which side view is obtained when Modified Example 1 is viewed from the X-direction of FIG. 1. (c) of FIG. 6 is a side view of Modified Example 1, which side view is obtained when Modified Example 1 is viewed form the Y-direction of FIG. 1.

An optical fiber supporting member in accordance with Modified Example 1 is different from the optical fiber supporting member 5 described above in that two column sections 15b are provided on two end section sides, along a lateral direction of the beam section 15a, of a beam section 15a. The beam section 15a, each of the two column sections 15b, a bonding film 16, and a bonding pad 17 are respectively identical with the beam section 5a, the column section 5b, the bonding film 6, and the bonding pad 7 of the optical fiber supporting member 5. Note that only one (on the right in (c) of FIG. 6) of the two column sections 15b, a distance between which one and the bonding pad 17 is greater than a distance between the other and the bonding pad 17, is bonded to the base 1 via the bonding film 16.

Note that the column section 15b (on the left in (c) of FIG. 6), the distance between which and the bonding pad 17 is smaller, can be (i) spaced apart from the base 1 or (ii) bonded to the base 1 via a bonding film (not shown) or the like which is made from a heat insulating material. In short, it is only necessary that the column section 15b (on the left in (c) of FIG. 6), the distance between which and the bonding pad 17 is smaller, be not thermally in contact with the base 1. This also applies to modified examples to be described below.

Modified Example 1 brings about the same effect as that provided by the optical fiber supporting member 5 illustrated in FIG. 2.

In the following description, the configuration of the optical fiber supporting member in accordance with Modified Example 1 and the configuration of the optical fiber supporting member 5 are collectively called "configuration A."

Modified Example 2

Figure 7:
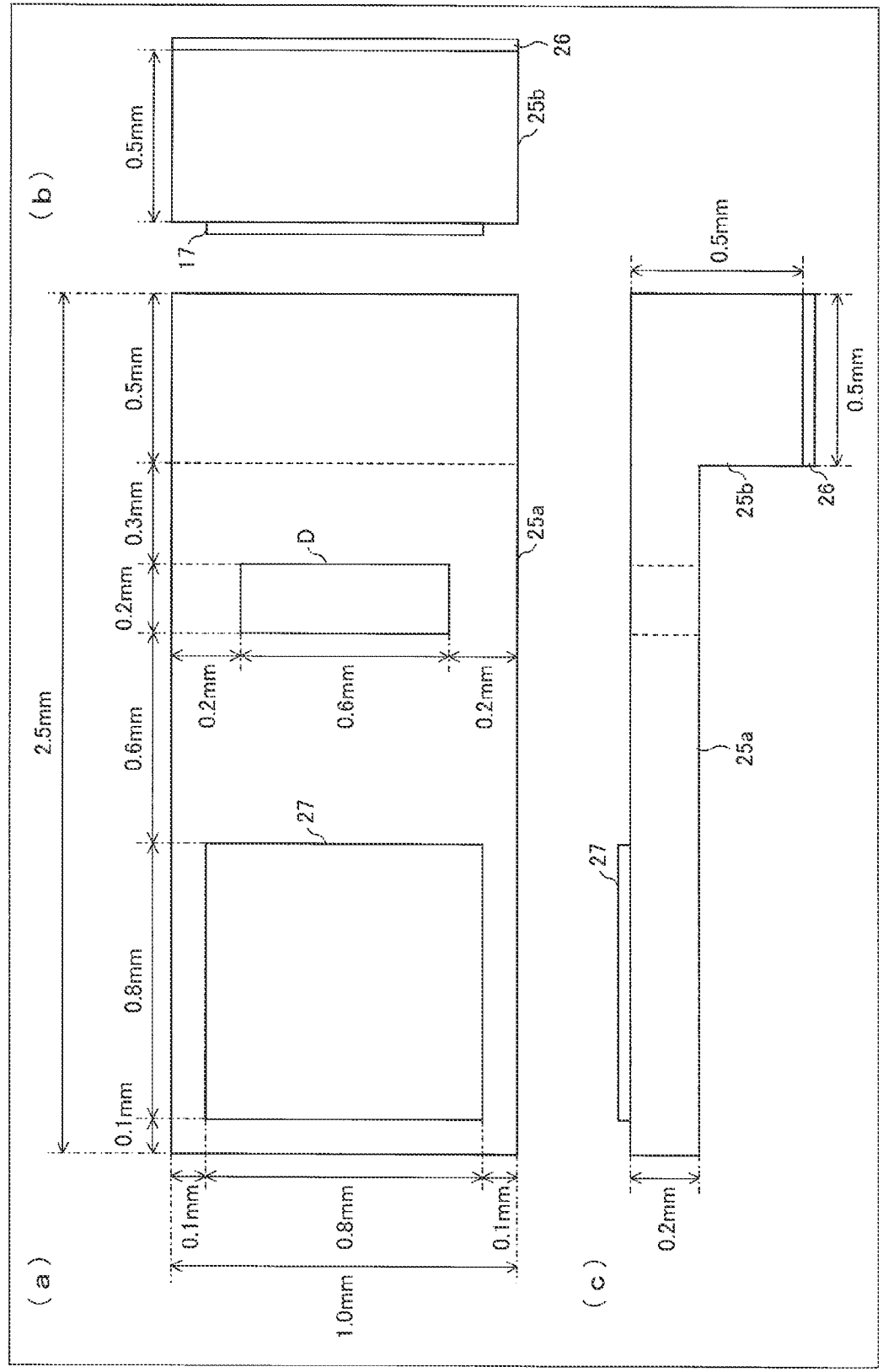
FIG. 7 is a trihedral drawing illustrating a modified example of the optical fiber supporting member of the laser device illustrated in FIG. 1. (a) of FIG. 7 is a plan view obtained when the modified example is viewed from the Z-direction of FIG. 1. (b) of FIG. 7 is a side view obtained when the modified example is viewed from the X-direction of FIG. 1. (c) of FIG. 7 is a side view obtained when the modified example is viewed from the Y-direction of FIG. 1.

FIG. 7 schematically illustrates a configuration of Modified Example 2 of the optical fiber supporting member of the laser device 100 in accordance with the one embodiment as described above. FIG. 7 is a trihedral drawing illustrating Modified Example 2 of the optical fiber supporting member 5 illustrated in FIG. 1. (a) of FIG. 7 is a plan view of Modified Example 2, which plan view is obtained when Modified Example 2 is viewed from the Z-direction of FIG. 1. (b) of FIG. 7 is a side view of Modified Example 2, which side view is obtained when Modified Example 2 is viewed from the X-direction of FIG. 1. (c) of FIG. 7 is a side view of Modified Example 2, which side view is obtained when Modified Example 2 is viewed form the Y-direction of FIG. 1.

An optical fiber supporting member in accordance with Modified Example 2 is different from the optical fiber supporting member 5 in that the beam section 5a of the optical fiber supporting member 5 is replaced by a beam section 25a, which is obtained by forming an opening section D in the beam section 5a. The column section 25b, a bonding film 26, and a bonding pad 27 are respectively identical with the column section 5b, the bonding film 6, and the bonding pad 7 of the optical fiber supporting member 5. The beam section 25a is identical with the beam section 5a of the optical fiber supporting member 5 except that beam section 25a has the opening section D.

Modified Example 2 brings about the same effect as that provided by the optical fiber supporting member 5 illustrated in FIG. 2.

Modified Example 3

Figure 8:
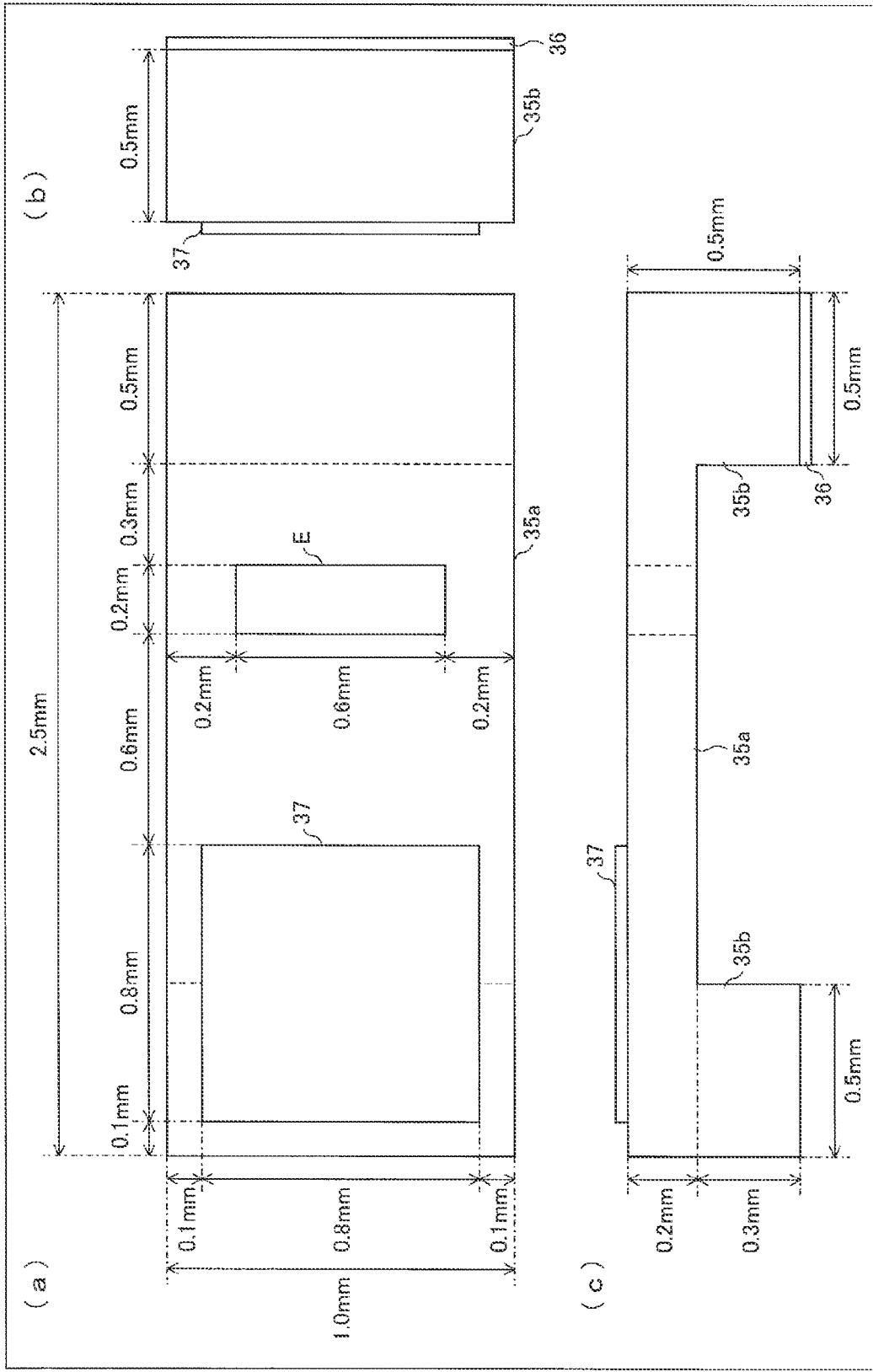
FIG. 8 is a trihedral drawing illustrating a modified example of the optical fiber supporting member of the laser device illustrated in FIG. 1. (a) of FIG. 8 is a plan view obtained when the modified example is viewed from the Z-direction of FIG. 1. (b) of FIG. 8 is a side view obtained when the modified example is viewed from the X-direction of FIG. 1. (c) of FIG. 8 is a side view obtained when the modified example is viewed from the Y-direction of FIG. 1.

FIG. 8 schematically illustrates a configuration of Modified Example 3 of the optical fiber supporting member of the laser device 100 in accordance with the one embodiment as described above. FIG. 8 is a trihedral drawing illustrating Modified Example 3 of the optical fiber supporting member 5 illustrated in FIG. 1. (a) of FIG. 8 is a plan view of Modified Example 3, which plan view is obtained when Modified Example 3 is viewed from the Z-direction of FIG. 1. (b) of FIG. 8 is a side view of Modified Example 3, which side view is obtained when Modified Example 3 is viewed from the X-direction of FIG. 1. (c) of FIG. 8 is a side view of Modified Example 3, which side view is obtained when Modified Example 3 is viewed form the Y-direction of FIG. 1.

An optical fiber supporting member in accordance with Modified Example 3 is different from the optical fiber supporting member 5 in that (i) the beam section 5a of the optical fiber supporting member 5 is replaced by a beam section 35a, which is obtained by forming an opening section E in the beam section 5a and (ii) two column sections 35b are provided respectively on two end section sides, along a lateral direction of the beam section 35a, of the beam section 35a.

Each of the two column sections 35b, a bonding film 36, and a bonding pad 37 are respectively identical with the column section 5b, the bonding film 6, and the bonding pad 7 of the optical fiber supporting member 5. The beam section 35a is identical with the beam section 5a of the optical fiber supporting member 5 except that the beam section 35a has the opening section E. Note that only one of the two column sections 35b, a distance between which one and the bonding pad 37 is greater than a distance between the other and the bonding pad 37, is bonded to the base 1 via the bonding film 36.

Modified Example 3 brings about the same effect as that provided by the optical fiber supporting member 5 illustrated in FIG. 2.

In the following description, the configuration of the optical fiber supporting member in accordance with Modified Example 3 and the configuration of the optical fiber supporting member in accordance with Modified Example 2 are collectively called "configuration B."

Modified Example 4

Figure 9:
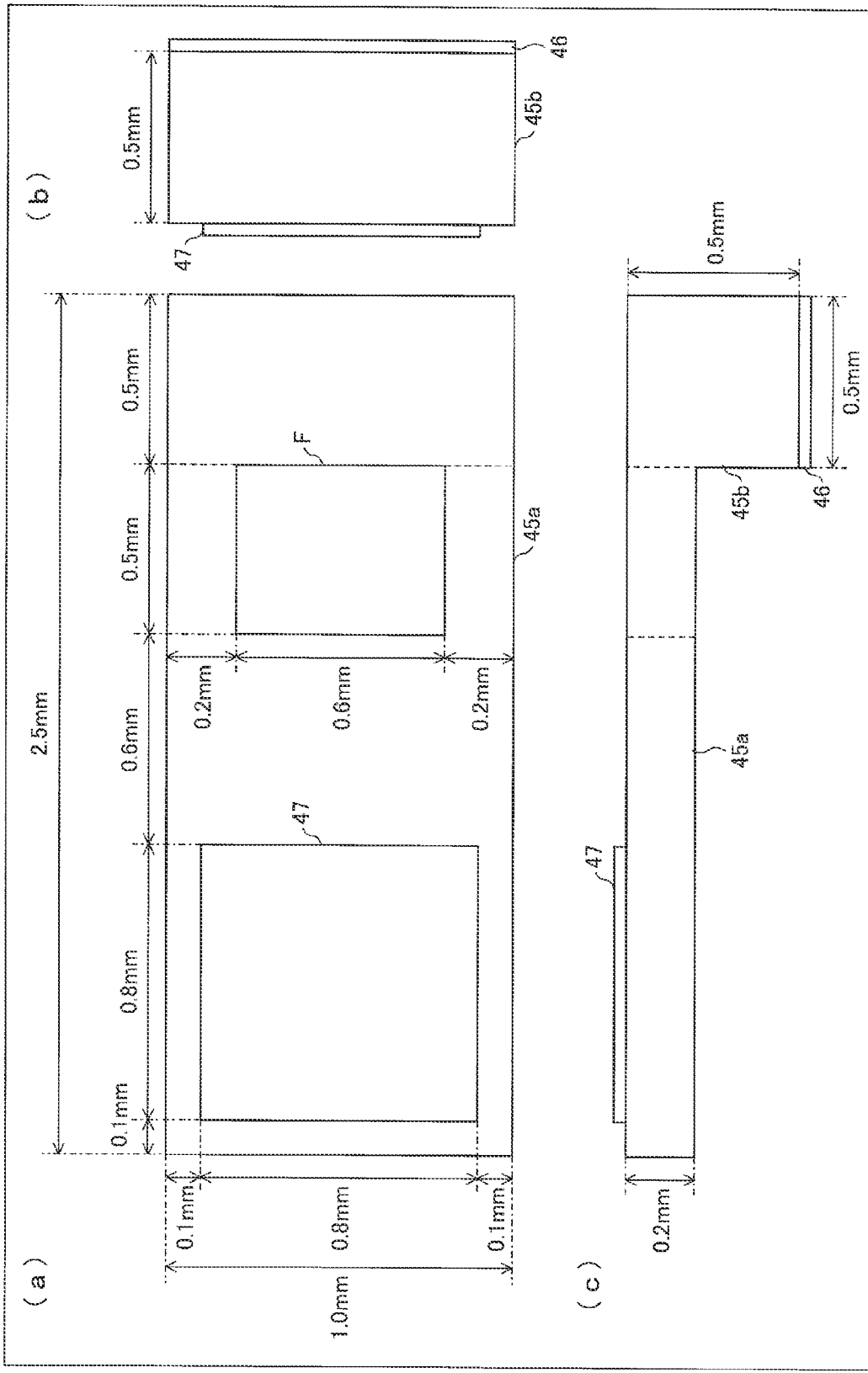
FIG. 9 is a trihedral drawing illustrating a modified example of the optical fiber supporting member of the laser device illustrated in FIG. 1. (a) of FIG. 9 is a plan view obtained when the modified example is viewed from the Z-direction of FIG. 1. (b) of FIG. 9 is a side view obtained when the modified example is viewed from the X-direction of FIG. 1. (c) of FIG. 9 is a side view obtained when the modified example is viewed from the Y-direction of FIG. 1.

FIG. 9 schematically illustrates a configuration of Modified Example 4 of the optical fiber supporting member of the laser device 100 in accordance with the one embodiment as described above. FIG. 9 is a trihedral drawing illustrating Modified Example 4 of the optical fiber supporting member 5 illustrated in FIG. 1. (a) of FIG. 9 is a plan view of Modified Example 4, which plan view is obtained when Modified Example 4 is viewed from the Z-direction of FIG. 1. (b) of FIG. 9 is a side view of Modified Example 4, which side view is obtained when Modified Example 4 is viewed from the X-direction of FIG. 1. (c) of FIG. 9 is a side view of Modified Example 4, which side view is obtained when Modified Example 4 is viewed form the Y-direction of FIG. 1.

An optical fiber supporting member in accordance with Modified Example 4 is different from the optical fiber supporting member 5 in that the beam section 5a of the optical fiber supporting member 5 is replaced by a beam section 45a, which is obtained by forming an opening section F in the beam section 5a. The column section 45b, a bonding film 46, and a bonding pad 47 are respectively identical with the column section 5b, the bonding film 6, and the bonding pad 7 of the optical fiber supporting member 5. The beam section 45a is identical with the beam section 5a of the optical fiber supporting member 5 except that beam section 45a has the opening section F.

Modified Example 4 brings about the same effect as that provided by the optical fiber supporting member 5 illustrated in FIG. 2.

Modified Example 5

Figure 10:
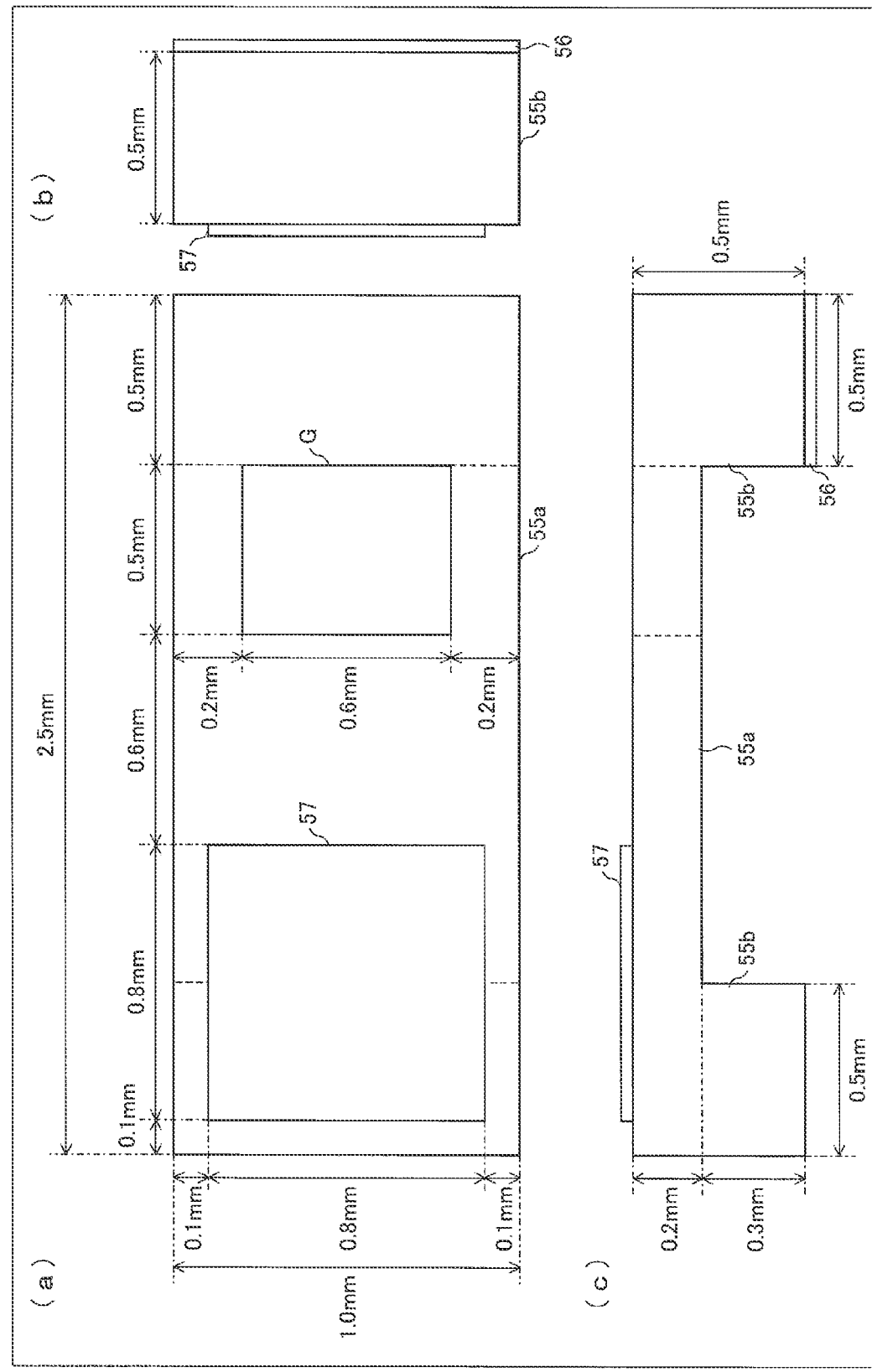
FIG. 10 is a trihedral drawing illustrating a modified example of the optical fiber supporting member of the laser device illustrated in FIG. 1. (a) of FIG. 10 is a plan view obtained when the modified example is viewed from the Z-direction of FIG. 1. (b) of FIG. 10 is a side view obtained when the modified example is viewed from the X-direction of FIG. 1. (c) of FIG. 10 is a side view obtained when the modified example is viewed from the Y-direction of FIG. 1.

FIG. 10 schematically illustrates a configuration of Modified Example 5 of the optical fiber supporting member of the laser device 100 in accordance with the one embodiment as described above. FIG. 10 is a trihedral drawing illustrating Modified Example 5 of the optical fiber supporting member 5 illustrated in FIG. 1. (a) of FIG. 10 is a plan view of Modified Example 5, which plan view is obtained when Modified Example 5 is viewed from the Z-direction of FIG. 1. (b) of FIG. 10 is a side view of Modified Example 5, which side view is obtained when Modified Example 5 is viewed from the X-direction of FIG. 1. (c) of FIG. 10 is a side view of Modified Example 5, which side view is obtained when Modified Example 5 is viewed form the Y-direction of FIG. 1.

An optical fiber supporting member in accordance with Modified Example 5 is different from the optical fiber supporting member 5 in that (i) the beam section 5a of the optical fiber supporting member 5 is replaced by a beam section 55a, which is obtained by forming an opening section G in the beam section 5a and (ii) two column sections 55b are provided respectively on two end section sides, along a lateral direction of the beam section 55a, of the beam section 55a.

Each of the two column sections 55b, a bonding film 56, and a bonding pad 57 are respectively identical with the column section 5b, the bonding film 6, and the bonding pad 7 of the optical fiber supporting member 5. The beam section 55a is identical with the beam section 5a of the optical fiber supporting member 5 except that the beam section 55a has the opening section G. Note that only one of the two column sections 55b, a distance between which one and the bonding pad 57 is greater than a distance between the other and the bonding pad 57, is bonded to the base 1 via the bonding film 56.

Modified Example 5 brings about the same effect as that provided by the optical fiber supporting member 5 illustrated in FIG. 2.

In the following description, the configuration of the optical fiber supporting member in accordance with Modified Example 5 and the configuration of the optical fiber supporting member in accordance with Modified Example 4 are collectively called "configuration C."

Modified Example 6

Figure 11:
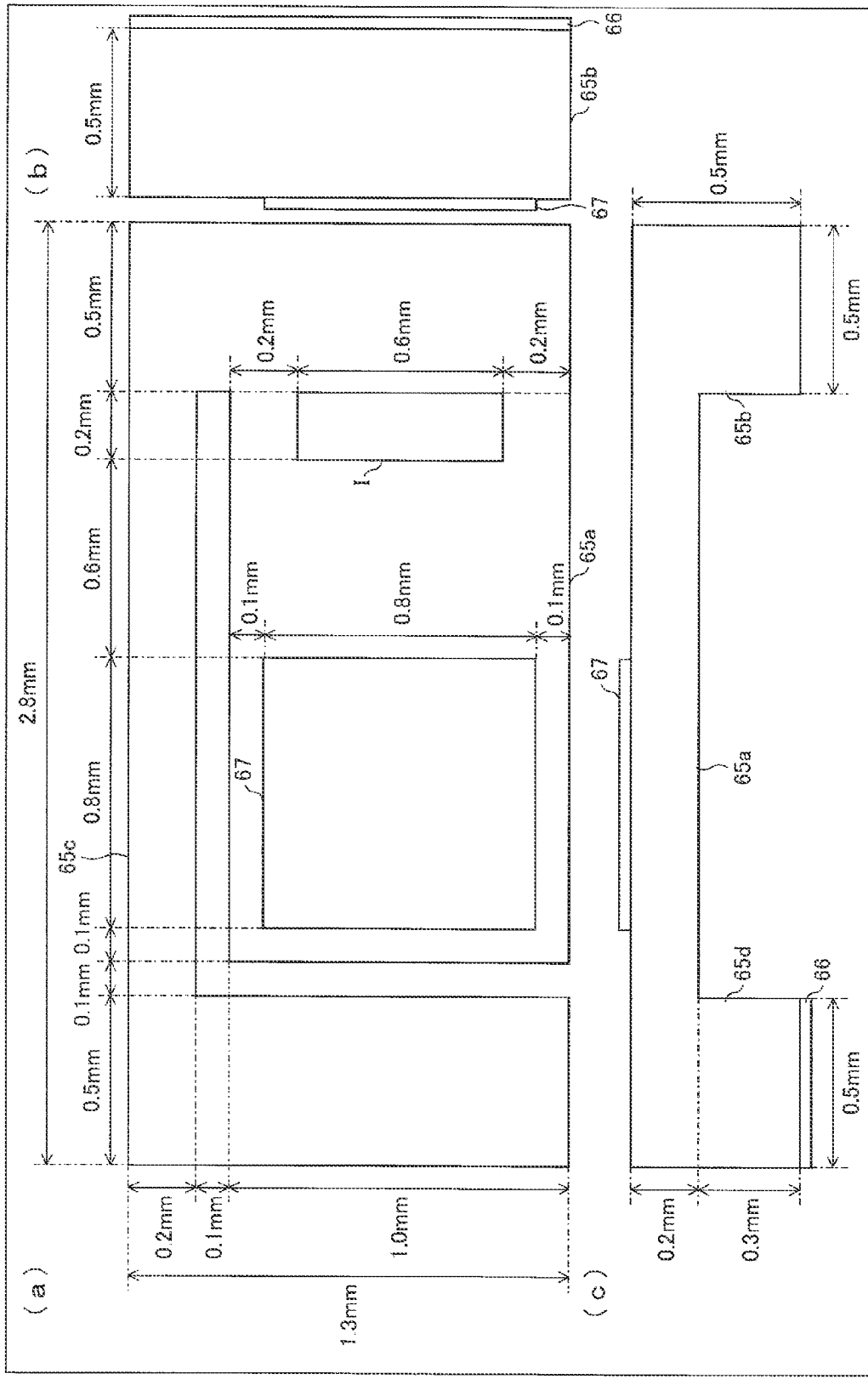
FIG. 11 is a trihedral drawing illustrating a modified example of the optical fiber supporting member of the laser device illustrated in FIG. 1. (a) of FIG. 11 is a plan view obtained when the modified example is viewed from the Z-direction of FIG. 1. (b) of FIG. 11 is a side view obtained when the modified example is viewed from the X-direction of FIG. 1. (c) of FIG. 11 is a side view obtained when the modified example is viewed from the Y-direction of FIG. 1.

FIG. 11 schematically illustrates a configuration of Modified Example 6 of the optical fiber supporting member of the laser device 100 in accordance with the one embodiment as described above. FIG. 11 is a trihedral drawing illustrating Modified Example 6 of the optical fiber supporting member 5 illustrated in FIG. 1. (a) of FIG. 11 is a plan view of Modified Example 6, which plan view is obtained when Modified Example 6 is viewed from the Z-direction of FIG. 1. (b) of FIG. 11 is a side view of Modified Example 6, which side view is obtained when Modified Example 6 is viewed from the X-direction of FIG. 1. (c) of FIG. 11 is a side view of Modified Example 6, which side view is obtained when Modified Example 6 is viewed form the Y-direction of FIG. 1.

An optical fiber supporting member in accordance with Modified Example 6 is different from the optical fiber supporting member 5 described above in that (1) the beam section 5a of the optical fiber supporting member 5 is replaced by a beam section 65a, which is obtained by forming two opening sections I in the beam section 5a, (2) two column sections 65b, 65d (a first column section 65b and a second column section 65d) are provided, and (3) an L-shaped expanded section 65c is added to the beam section 65a.

The expanded section 65c extends from a first end section of the beam section 65a, which first end section is opposite from a second end section of the beam section 65a, which second end section is on a side where a bonding pad 67 is provided. The expanded section 65c extends along one long side and one short side of the beam section 65a. The first column section 65b is connected with a lower surface of the first end section of the beam section 65a, and the second the column section 65d is connected with a lower surface of a leading end portion (linear section, along the second end section of the beam section 65a, of the expanded section 65c) of the expanded section 65c. Out of the two column sections, only the column section 65d having a greater distance from the bonding pad 67 is bonded to the base 1 via a bonding film 66. Note that the distance from the bonding pad 67 denotes a distance from the bonding pad 67 which distance is measured along a route for releasing heat.

The column section 65b, the bonding film 66, and the bonding pad 67 are respectively identical with the column section 5b, the bonding film 6, and the bonding pad 7 of the optical fiber supporting member 5. The beam section 65a is identical with the beam section 5a of the optical fiber supporting member 5 except that the beam section 65a has the two opening sections I.

Modified Example 6 brings about the same effect as that provided by the optical fiber supporting member 5 illustrated in FIG. 2.

In the following description, the configuration of the optical fiber supporting member in accordance with Modified Example 6 is called "configuration D."

Modified Example 7

Figure 12:
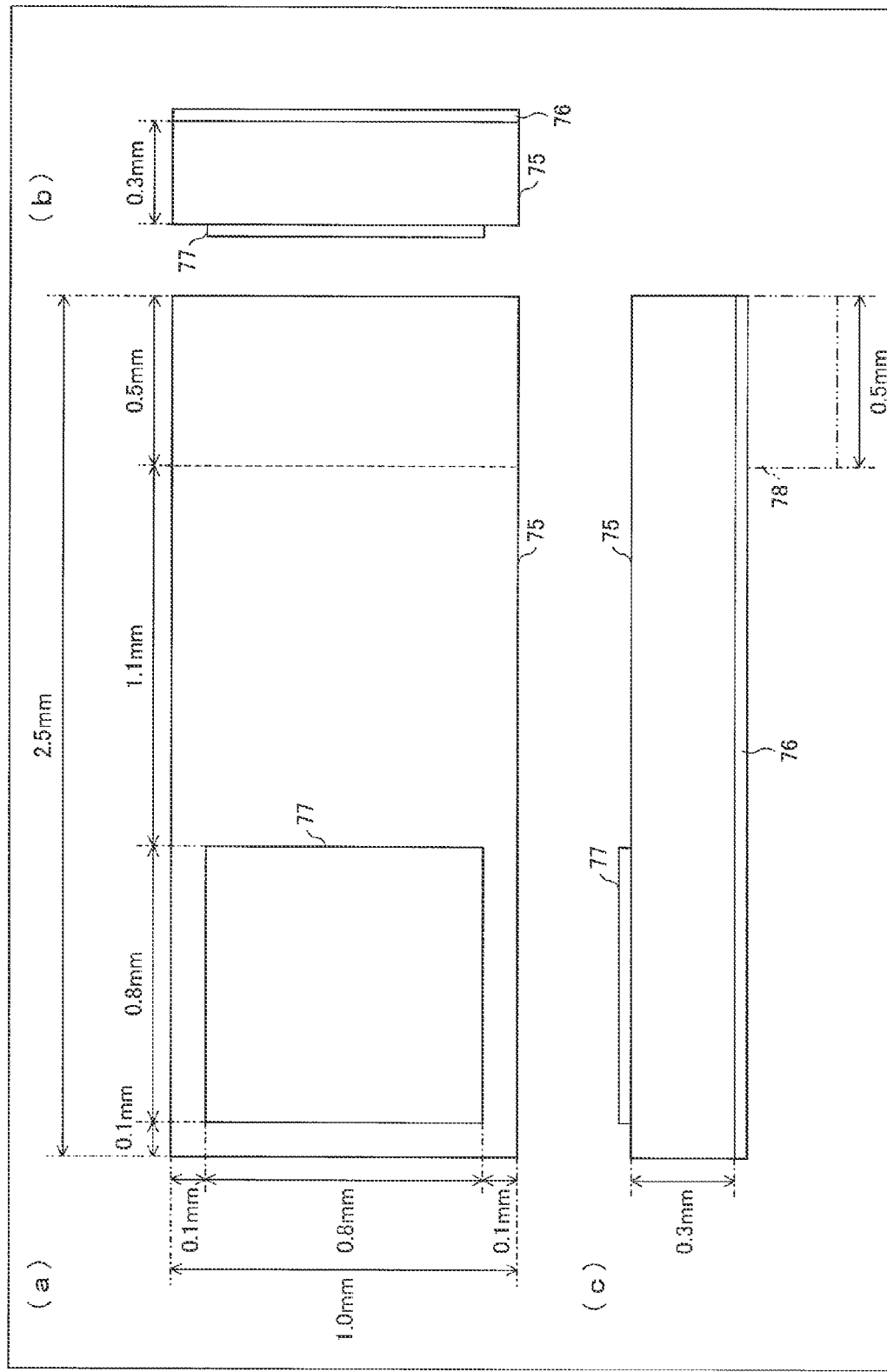
FIG. 12 is a trihedral drawing illustrating a modified example of the optical fiber supporting member of the laser device illustrated in FIG. 1. (a) of FIG. 12 is a plan view obtained when the modified example is viewed from the Z-direction of FIG. 1. (b) of FIG. 12 is a side view obtained when the modified example is viewed from the X-direction of FIG. 1. (c) of FIG. 12 is a side view obtained when the modified example is viewed from the Y-direction of FIG. 1.

FIG. 12 schematically illustrates a configuration of Modified Example 7 of the optical fiber supporting member of the laser device 100 in accordance with the one embodiment as described above. FIG. 12 is a trihedral drawing illustrating Modified Example 7 of the optical fiber supporting member 5 illustrated in FIG. 1. (a) of FIG. 12 is a plan view of Modified Example 7, which plan view is obtained when Modified Example 7 is viewed from the Z-direction of FIG. 1. (b) of FIG. 12 is a side view of Modified Example 7, which side view is obtained when Modified Example 7 is viewed from the X-direction of FIG. 1. (c) of FIG. 12 is a side view of Modified Example 7, which side view is obtained when Modified Example 7 is viewed form the Y-direction of FIG. 1.

An optical fiber supporting member in accordance with Modified Example 7 is different from the optical fiber supporting member 5 described above in that a beam section 75 of the optical fiber supporting member 5 is bonded, without using the column section 5b of the optical fiber supporting member 5, to a base convex section 78 provided on the base 1, so that a bonding film 76 is sandwiched between the beam section 75 and the base 1.

The bonding pad 77 is identical with the bonding pad 7 of the optical fiber supporting member 5.

Modified Example 7 brings about the same effect as provided by the optical fiber supporting member 5 illustrated in FIG. 2.

In the following description, the configuration of the optical fiber supporting member in accordance with Modified Example 7 is called "configuration E."

Modified Example 8

Figure 13:
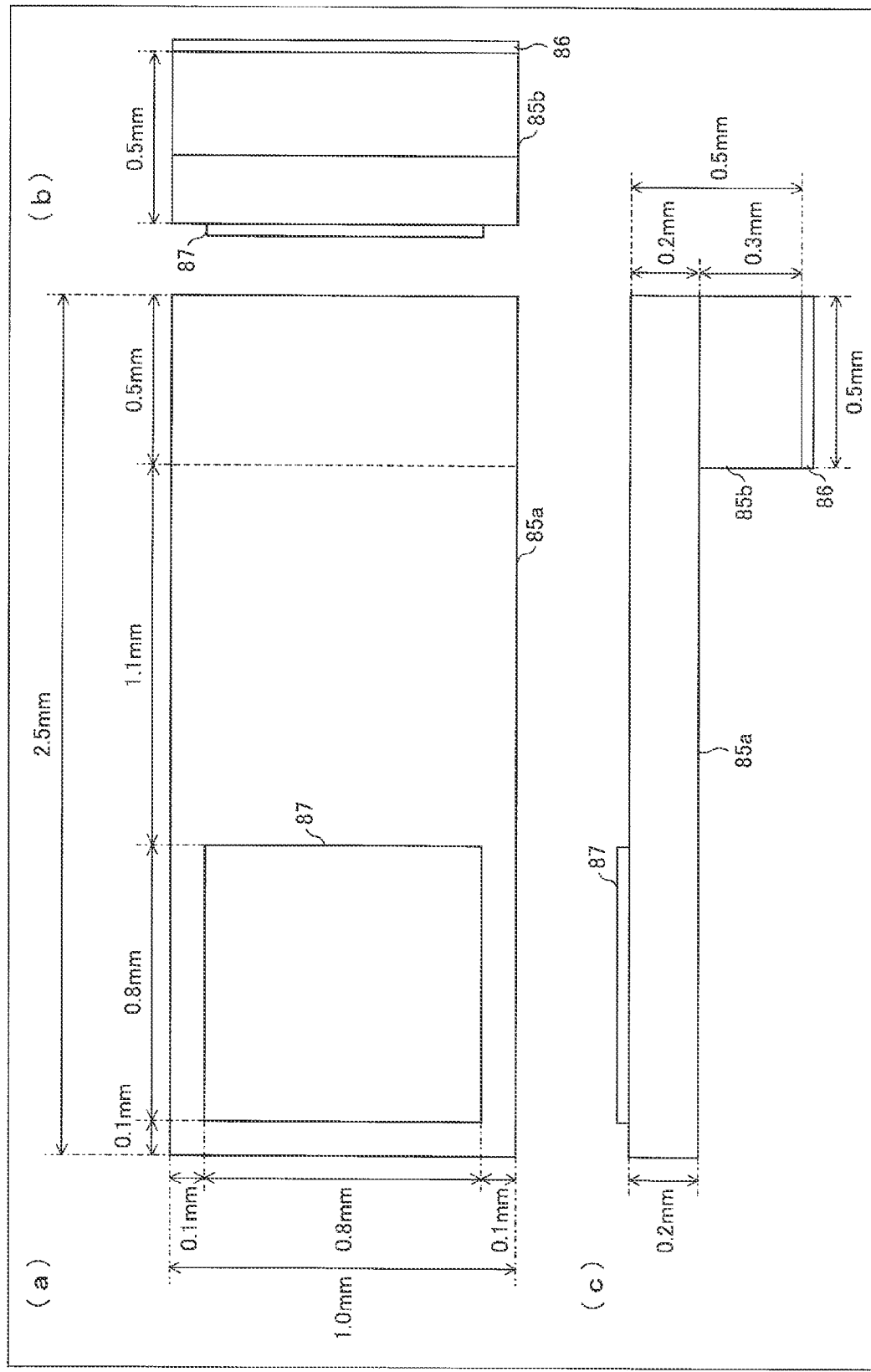
FIG. 13 is a trihedral drawing illustrating a modified example of the optical fiber supporting member of the laser device illustrated in FIG. 1. (a) of FIG. 13 is a plan view obtained when the modified example is viewed from the Z-direction of FIG. 1. (b) of FIG. 13 is a side view obtained when the modified example is viewed from the X-direction of FIG. 1. (c) of FIG. 13 is a side view obtained when the modified example is viewed from the Y-direction of FIG. 1.

FIG. 13 schematically illustrates a configuration of Modified Example 8 of the optical fiber supporting member of the laser device 100 in accordance with the one embodiment as described above. FIG. 13 is a trihedral drawing illustrating Modified Example 8 of the optical fiber supporting member 5 illustrated in FIG. 1. (a) of FIG. 13 is a plan view of Modified Example 8, which plan view is obtained when Modified Example 8 is viewed from the Z-direction of FIG. 1. (b) of FIG. 13 is a side view of Modified Example 8, which side view is obtained when Modified Example 8 is viewed from the X-direction of FIG. 1. (c) of FIG. 13 is a side view of Modified Example 8, which side view is obtained when Modified Example 8 is viewed form the Y-direction of FIG. 1.

An optical fiber supporting member in accordance with Modified Example 8 is different from the optical fiber supporting member 5 described above in that the column section 5b of the optical fiber supporting member 5 is replaced by a column section 85b, a material of a part of which is different from a material of the column section 5b. For example, in FIG. 2, in a case where the column section 5b is made from a brittle material such as Si, there is a possibility that stress generated due to a difference in thermal expansion coefficient between to the base 1 and the column section 5b causes the beam section 5a or the column section 5b to be broken after the base 1 and the column section 5b are fixed. As such, in Modified Example 8, the part of the column section 85b is replaced by a metal, such as Mo, which has a thermal expansion coefficient close to that of Si. This allows the column section 85b to serve as a cushioning material for absorbing stress which is generated when the base 1 and the column section 5b is fixed to each other.

The beam section 85a, the bonding film 86, and the bonding pad 87 are respectively identical with the column section 5b, the bonding film 6, and the bonding pad 7 of the optical fiber supporting member 5.

Modified Example 8 brings about the same effect as that provided by the optical fiber supporting member 5 illustrated in FIG. 2.

In the following description, the configuration of the optical fiber supporting member in accordance with Modified Example 8 is called "configuration F."

FIG. 14 shows a heat resistance and a heat conductance of each of the configurations A through F of the above-described optical fiber supporting members (the optical fiber supporting member 5, and the optical fiber supporting members in accordance with Modified Examples 1, 3, and 5 through 8 of the optical fiber supporting member 5). The heat resistance and the heat conductance are found in each of the following cases: (i) an optical fiber support member is made from Ni, (ii) an optical fiber support member is made from Mo, (iii) an optical fiber support member is made from Si, (iv) an optical fiber support member is made from CuW (or MN), and (v) an optical fiber support member is made from Cu.

As shown in FIG. 14, in a case where an optical fiber supporting member is made from Ni, each of the configuration E and the configuration F can have a heat resistance of not higher than 6×10° C./W as described above and, similarly, a heat conductance of not lower than $1.67 \times 10^{-2}$ W/° C.

In this case, by setting the output of the laser light 10 illustrated in (a) of FIG. 5 to 27 W and setting the output of the laser light 11 illustrated in (a) of FIG. 5 to 8 W, it is possible to achieve the effect as described above of the optical fiber supporting member 5.

In a case where an optical fiber supporting member is made from Mo, each of the configuration A, the configuration B, the configuration E, and the configuration F can have a heat resistance of not higher than 6×10° C./W as described above and, similarly, a heat conductance of not lower than $1.67 \times 10^{-2}$ W/° C.

In this case, by setting the output of the laser light 10 illustrated in (a) of FIG. 5 to 27 W and setting the output of the laser light 11 illustrated in (a) of FIG. 5 to 8 W, it is possible to achieve the effect as described above of the optical fiber supporting member 5.

In a case where an optical fiber supporting member is made from Si, each of the configuration A, the configuration B, the configuration E, and the configuration F can have a heat resistance of not higher than 6×10° C./W as described above and, similarly, a heat conductance of not lower than $1.67 \times 10^{-2}$ W/° C.

In this case, by setting the output of the laser light 10 illustrated in (a) of FIG. 5 to 27 W and setting the output of the laser light 11 illustrated in (a) of FIG. 5 to 8 W, it is possible to achieve the effect as described above of the optical fiber supporting member 5.

In a case where an optical fiber supporting member is made from CuW (or AlN), each of the configuration A, the configuration B, the configuration C, the configuration E, and the configuration F can have a heat resistance of not higher than 6×10° C./W as described above and, similarly, a heat conductance of not lower than $1.67 \times 10^{-2}$ W/° C.

In this case, with the configuration A, the configuration B, the configuration C, and the configuration F, it is possible to achieve the effect as described above of the optical fiber supporting member 5 by setting the output of the laser light 10 illustrated in (a) of FIG. 5 to 27 W and setting the output of the laser light 11 illustrated in (a) of FIG. 5 to 8 W.

With the configuration E, it is possible to achieve the effect as described above of the optical fiber supporting member 5 by setting the output of the laser light 10 illustrated in (a) of FIG. 5 to 54 W and setting the output of the laser light 11 illustrated in (a) of FIG. 5 to 8 W.

In a case where the optical fiber supporting member is made from Cu, each of the configuration A, the configuration B, the configuration C, the configuration D, the configuration E, and the configuration F can have a heat resistance of not higher than 6×10° C./W as described above and, similarly, a heat conductance of not lower than $1.67 \times 10^{-2}$ W/° C.

In this case, with the configuration B, the configuration C, the configuration D, and the configuration F, it is possible to achieve the effect as described above of the optical fiber supporting member 5 by setting the output of the laser light 10 illustrated in (a) of FIG. 5 to 27 W and setting the output of the laser light 11 illustrated in (a) of FIG. 5 to 8 W.

With the configuration A and the configuration E, it is possible to achieve the effect as described above of the optical fiber supporting member 5 by setting the output of the laser light 10 illustrated in (a) of FIG. 5 to 108 W and setting the output of the laser light 11 illustrated in (a) of FIG. 5 to 8 W.

As shown in FIG. 14, acceleration of melting the solder 8a by applying laser light directly to the solder 8a described above allows each of the configuration E with an optical fiber supporting member that is made from CuW (or AlN), the configuration A with an optical fiber supporting member that is made from Cu, and the configuration E with an optical fiber supporting member that is made from Cu to bring about the same effect as that provided by the optical fiber supporting member 5 of the one embodiment as described above.

Figure 15:
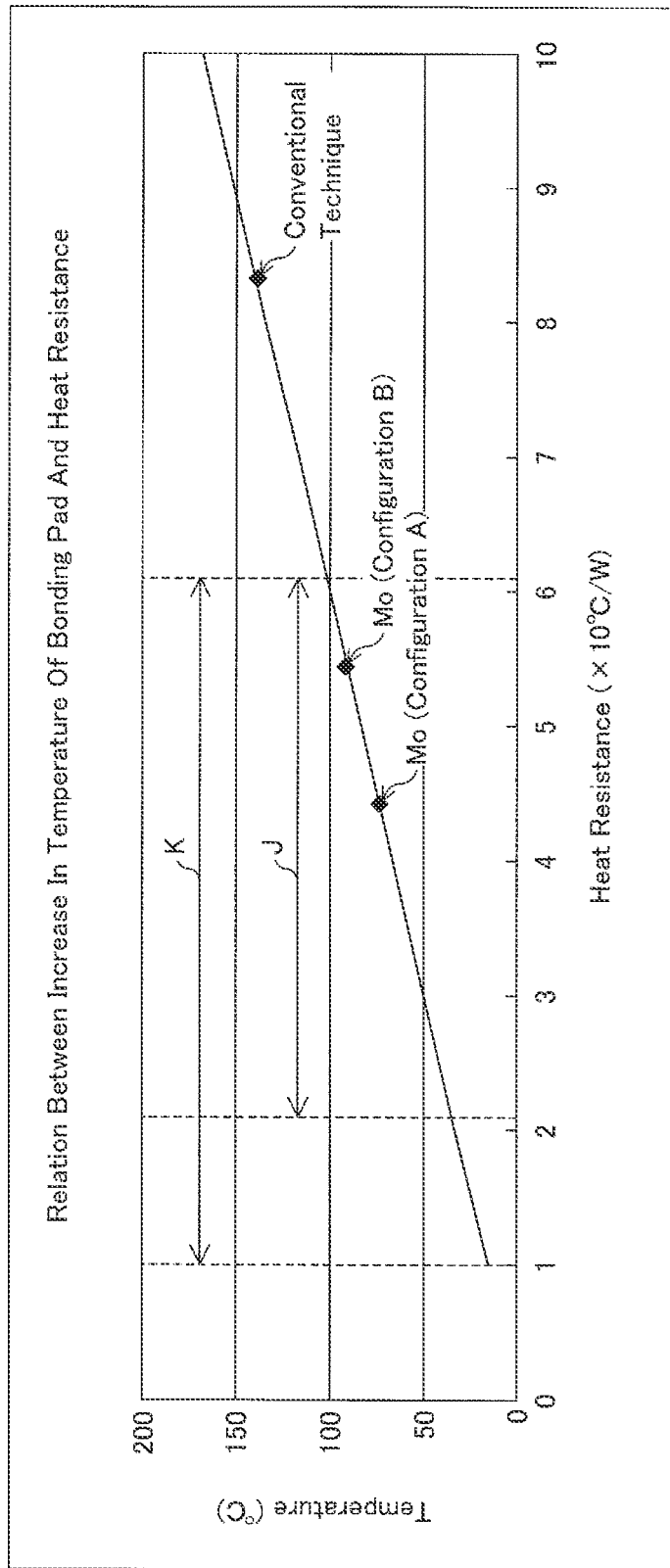
FIG. 15 is a graph showing a relation between (i) an increase in temperature of the bonding pad of the optical fiber supporting member of the laser device illustrated in FIG. 1 and (ii) a heat resistance of the optical fiber supporting member.

FIG. 15 is a graph showing a relation between an increase in temperature of the bonding pad 7 and a heat resistance of an optical fiber supporting member. Note that the range indicated by J in FIG. 15 is a range of heat resistance found in a case where the output of the laser light 10 illustrated in (a) of FIG. 5 is set to 27 W and the output of the laser light 11 illustrated in (a) of FIG. 5 is set to 8 W. The range indicated by K in FIG. 15 is a range of heat resistance found in a case where the output of the laser light 10 is set to 54 W and the output of the laser light 11 is set to 8 W. As indicated by J in FIG. 15, in a case of the former range of heat, the heat resistance of the optical fiber supporting member is not lower than 20° C./W but not higher than 60° C./W. As indicated by K in FIG. 15, in a case of the latter range of heat, the heat resistance of the optical fiber supporting member is not lower than 10° C./W but not higher than 60° C./W.

As shown in FIG. 15, in a case where the heat insulating material having a thermal conductivity of 3 W/m·° C. as shown by the item "conventional technique" in FIG. 4 is used as an optical fiber supporting member, application of heat in an amount of 1 W to the solder 8 causes the temperature of the optical fiber supporting member to increase to 150° C.

By contrast, it is possible to limit an increase in temperature of the optical fiber supporting member of the present invention so that the temperature does not exceed 100° C.

For example, in a case where (i) the solder 8 is made from, for example, 20% AuSn (melting point: 278° C.) and (ii) the output of the semiconductor laser element 2 is set to 10 W to 20 W, light of about 2 W is absorbed by the solder 8 when the optical coupling rate of the semiconductor laser element 2 and the optical fiber 4 is about 85%.

In this case, if the heat insulating material having a thermal conductivity of 3 W/m·° C. as shown by the item "conventional technique" in FIG. 4 is used as the optical fiber supporting member, the solder 8 and the optical fiber around the solder 8 is heated to almost 300° C. By contrast, according to the present invention, the solder 8 and the optical fiber 4 around the solder 8 is heated to 200° C. or lower, so that an influence of temperature increase of the optical fiber 4 and the solder 8 can be avoided.

CONCLUSION

As described above, a laser device in accordance with the present embodiment includes: a laser element having an output surface via which light is outputted; an optical fiber having a leading end portion which faces the output surface of the laser element; and a supporting member for supporting the optical fiber, the supporting member being made from a non heat insulating material and having a solder fixation section to which the optical fiber is fixed by use of solder, the supporting member including a contact portion which is thermally in contact with a heat releasing member, the solder fixation section (i) being spaced apart from the contact portion so as to be located on a side opposite from the contact portion so that a region to which laser light is applied from another laser element when the optical fiber is fixed to the solder fixation section is sandwiched between the solder fixation section and the contact portion and (ii) being separated spatially from the heat releasing member.

In the laser device, the non heat insulating material is used as the supporting member. This allows heat absorbed by the solder fixation section to be conducted efficiently from the solder fixation section to the contact portion when laser light is introduced from the laser element to the optical fiber.

As such, even in a case where (i) laser light that has not been introduced to a core section of the optical fiber out of the laser light outputted from the output surface of the laser element is applied directly to the solder, so that the solder generates heat and the solder fixation section starts absorbing the heat or (ii) laser light introduced to a clad section of the optical fiber is applied to a metallic coating member of the optical fiber, so that the metallic coating member generates heat and the solder fixation section starts absorbing the heat, it is possible to cause the heat to be released efficiently.

However, merely changing the supporting member from a heat insulating material to the non heat insulating material causes a problem that a main surface of the supporting member, on which the solder fixation section is provided, has a large temperature gradient for the following reason. That is, when the laser light is applied so as to fix the optical fiber to the solder fixation section while melting the solder, there is a sharp heat gradient from a region, to which the laser light is applied, to the contact portion due to a significant increase in heat releasing efficiency of the supporting member, which increase is brought about by change from the heat insulating material to the non heat insulating material. The sharp heat gradient prevents supply of a sufficient amount of heat into the main surface.

As such, the laser device above employs a configuration in which the solder fixation section is spaced apart from the contact portion and is separated spatially from the heat releasing member.

Accordingly, by applying, at the time of fixing the optical fiber to the solder fixation section while melting the solder, laser light to a region (laser light application region) which is spaced apart from the solder fixation section toward the contact portion, it is possible to cause heat conducted toward the solder fixation section out of heat generated from the laser light application region to stay within the main surface of the supporting member, to which the solder fixation section, in a part of the supporting member which part extends from the laser light application region toward the solder fixation section. This allows the temperature gradient in the main surface to be small. This is made possible for the following reason. That is, since the solder fixation section is located at a position opposite from the contact portion with respect to the laser light application region, it is less likely that there is a sharp heat gradient. This allows the temperature gradient in the main surface to be small, so that the solder can be applied onto the solder fixation section more uniformly.

This makes it possible to achieve high mounting reliability. That is, (i) heat supply to the solder fixation section can be stabilized at the time of fixing the optical fiber to the solder fixation section and (ii) heat release from the solder fixation section can be stabilized at the time of introducing laser light from the laser element to the core section of the optical fiber.

In the laser device above, it is preferable that the non heat insulating material have a heat resistance of not lower than 10° C./W but not higher than 60° C./W between the solder fixation section and the contact portion.

In this case, at the time of introducing the laser light from the laser element to the core section of the optical fiber, it is possible to cause heat absorbed by the solder fixation section to be conducted in the supporting member more efficiently.

On the other hand, at the time of fixing the optical fiber to the solder fixation section, it is possible to supply a sufficient amount of heat into the main surface of the supporting member, on which main surface the solder fixation section is provided. This allows the temperature gradient in the main surface to be smaller.

In the laser device above, it is preferable that the supporting member includes (i) a flat plate section including a first main surface on which the solder fixation section is provided and a second main surface which is opposite to the first main surface and which faces the heat releasing member while being spaced apart from the heat releasing member and (ii) a maintaining section which is fixed onto the heat releasing member and is connect with the flat plate section at a position closer to an end section of the flat plate section so as to maintain space between the second main surface and the heat releasing member; and the contact portion is a portion at which the maintaining section is fixed to the heat releasing member.

In this case, since the maintaining section fixed onto the heat releasing member is connected with the flat plate section at the position closer to the end section of the flat plate section, it is possible to cause heat conducted in the flat plate section to be conducted in the maintaining section and then released from the heat releasing member.

In the laser device, it is preferable that the maintaining section is connected with the flat plate section at a position closer to one of end sections, along a lateral direction of the flat plate section, of the flat plate section than to the other of the end sections; and the solder fixation section is provided at a position closer to the other of the end sections of the flat plate section.

In this case, the solder fixation section and the maintaining section become more separated from each other as a longitudinal length of the flat plate section increases.

This allows a distance between the solder fixation section and the maintaining section to be increased. Accordingly, at the time of fixing the optical fiber to the solder fixation section, the amount of heat that stays within the main surface of the supporting member, on which main surface the solder fixation section is provided, can be increased, so that the temperature gradient in the main surface to be smaller.

A method for manufacturing a laser device in accordance with the present embodiment is a method for manufacturing a laser device including: including a supporting member for supporting an optical fiber, the supporting member (i) being made from a non heat insulating material and (ii) including a solder fixation section to which the optical fiber is fixed by use of solder, the supporting member including a contact portion which is thermally in contact with a heat releasing member, the solder fixation section (i) being spaced apart from the contact portion so as to be located on a side opposite from the contact portion so that a laser light application region to which laser light is applied from a laser element when the optical fiber is fixed to the solder fixation section is sandwiched between the solder fixation section and the contact portion and (ii) being separated spatially from the heat releasing member, the method comprising: applying laser light to the laser light application region when the optical fiber is fixed to the solder fixation section by use of solder; and melting the solder by using an increase in temperature of the solder fixation section, which increase is caused by heat conducted from the laser light application region to a solder fixation section side.

According to the method for manufacturing the laser device, it is possible to apply laser light to a region is spaced apart from the solder fixation section toward the contact portion, at the time of fixing the optical fiber to the solder fixation section while melting the solder.

Accordingly, by applying, at the time of fixing the optical fiber to the solder fixation section while melting the solder, laser light to a region (laser light application region) which is spaced apart from the solder fixation section toward the contact portion, it is possible to cause heat conducted toward the solder fixation section out of heat generated from the laser light application region to stay within the main surface of the supporting member, to which the solder fixation section, in a part of the supporting member which part extends from the laser light application region toward the solder fixation section. This allows a sufficient amount of heat to be supplied into the main surface, so that a temperature gradient in the main surface can be made small. Consequently, the solder can be applied onto the solder fixation section more uniformly.

This makes it possible to achieve high mounting reliability. That is, (i) heat supply to the solder fixation section can be stabilized at the time of fixing the optical fiber to the solder fixation section and (ii) heat release from the solder fixation section can be stabilized at the time of introducing laser light from the laser element to the core section of the optical fiber.

[Additional Matter]

The present invention is not limited to the above-described embodiments but allows various modifications within the scope of the claims. In other words, any embodiment derived from a combination of two or more technical means appropriately modified within the scope of the claims will also be included in the technical scope of the present invention.

INDUSTRIAL APPLICABILITY

The present invention can be applied to a laser device which is obtained by combining a laser element such as a semiconductor laser element and an optical component such as an optical fiber.

REFERENCE SIGNS LIST

1: base (heat releasing member)
2: semiconductor laser element (laser element)
2a: output surface
3: laser element supporting member
4: optical fiber
4a: leading end portion
5: optical fiber supporting member (supporting member)
5a, 15a, 25a, 35a, 45a, 55a, 65a, 75, and 85a: beam section (flat plate section)
5b, 15b, 25b, 35b, 45b, 55b, 65b, and 85b: column section (maintaining section)
6, 16, 26, 36, 46, 56, and 66: bonding film
7, 17, 27, 37, 47, 57, and 67: bonding pad (solder fixation section)
8 and 8a: solder
9: metallic coating member
10 and 11: laser light
100: laser device

The invention claimed is:

1. A method for manufacturing a laser device including:
a laser element having an output surface via which light is outputted;
an optical fiber having a leading end portion which faces the output surface of the laser element; and
a supporting member for supporting the optical fiber, the supporting member being made from a non heat insulating material,
the supporting member including (i) a column section having a rectangular parallelepiped shape and including a lower surface which includes a contact portion which is thermally in contact with a heat releasing member, and (ii) a beam section having a platelike shape and including (a) an upper surface including a solder fixation section to which the optical fiber is fixed by use of solder and (b) a lower surface including a connection section with which an upper surface of the column section is connected, a part of the lower surface other than the connection section facing the heat releasing member while being spaced apart from the heat releasing member,
the beam section being made up of a first section which includes the solder fixation section, a second section which includes the connection section, and a third section which is sandwiched between the first section and the second section and does not include the solder fixation section or the connection section, a boundary plane between the first section and the second section and a boundary plane between the second section and the third section being perpendicular to the upper surface and the lower surface of the beam section,
the method comprising the steps of:
(a) applying laser light to the third section of the beam section when the optical fiber is fixed to the solder fixation section by use of the solder; and
(b) melting the solder by using an increase in temperature of the solder fixation section, the increase being caused by heat conducted from the third section of the beam section to the first section of the beam section.

2. The method as set forth in claim 1, wherein:
the non heat insulating material has a heat resistance of not lower than 10° C./W but not higher than 60° C./W.

3. The method as set forth in claim 1, wherein:
the first section includes one end section, along a lateral direction of the beam section, of the beam section; and
the second section includes another end section of the beam section.

4. The method as set forth in claim 1, wherein:
in step (a), the laser light is applied to the third section of the beam section from an upper surface side of the beam section.

* * * * *